US012562225B2

(12) United States Patent
Li et al.

(10) Patent No.: US 12,562,225 B2
(45) Date of Patent: Feb. 24, 2026

(54) HYBRID MEMORY FOR NEUROMORPHIC APPLICATIONS

(71) Applicant: INTERNATIONAL BUSINESS MACHINES CORPORATION, Armonk, NY (US)

(72) Inventors: Juntao Li, Cohoes, NY (US); Kangguo Cheng, Schenectady, NY (US); Carl Radens, Lagrangeville, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 553 days.

(21) Appl. No.: 17/472,145

(22) Filed: Sep. 10, 2021

(65) Prior Publication Data

US 2023/0082961 A1 Mar. 16, 2023

(51) Int. Cl.
*G11C 11/00* (2006.01)
*G11C 13/00* (2006.01)

(52) U.S. Cl.
CPC ........ *G11C 13/0097* (2013.01); *G11C 13/004* (2013.01); *G11C 13/0069* (2013.01)

(58) Field of Classification Search
CPC .............. G11C 13/0097; G11C 13/004; G11C 13/0069
USPC .......................................... 365/148
See application file for complete search history.

(56) References Cited

U.S. PATENT DOCUMENTS

| | | | |
|---|---|---|---|
| 7,656,696 B2 | 2/2010 | Joo | |
| 7,939,366 B2 | 5/2011 | Song | |
| 8,026,502 B2 | 9/2011 | Kakegawa | |
| 9,082,964 B2 | 7/2015 | Hong | |
| 9,444,046 B2 | 9/2016 | Pio | |
| 9,680,092 B2 | 6/2017 | Nardi | |
| 9,837,472 B2 | 12/2017 | Shepard | |
| 9,865,322 B2 | 1/2018 | Dray | |
| 9,917,104 B1 | 3/2018 | Roizin | |
| 9,946,969 B2 | 4/2018 | Friedman | |
| 10,048,962 B2 | 8/2018 | Amidi | |
| 10,056,545 B2 | 8/2018 | Sato | |
| 10,109,675 B2 | 10/2018 | Annunziata | |
| 10,454,025 B1 * | 10/2019 | Cheng .................. H10N 70/043 | |
| 11,696,518 B2 | 7/2023 | Cheng et al. | |
| 2010/0054029 A1 | 3/2010 | Happ | |
| 2012/0084240 A1 | 4/2012 | Esser | |
| 2012/0084241 A1 | 4/2012 | Friedman | |
| 2015/0255151 A1 * | 9/2015 | Ogiwara ............. G11C 11/2275 365/148 |

(Continued)

FOREIGN PATENT DOCUMENTS

| | | |
|---|---|---|
| CN | 116472790 A | 7/2023 |
| EP | 4248501 A1 | 9/2023 |

(Continued)

OTHER PUBLICATIONS

International Search Report and Written Opinion for Application PCT/EP2021/081868, Feb. 28, 2022, 11 pages.

(Continued)

*Primary Examiner* — Anthan Tran

(74) *Attorney, Agent, or Firm* — Jeffrey M. Ingalls

(57) ABSTRACT

A memory device is provided. The memory device includes a ReRAM memory element, and a PCM memory element that is electrically connected in parallel with the ReRAM memory element.

10 Claims, 21 Drawing Sheets

Hybrid memory cell

PCM    ReRAM

(56) References Cited

U.S. PATENT DOCUMENTS

| | | | |
|---|---|---|---|
| 2015/0279899 A1* | 10/2015 | Kim | H01L 27/14614 |
| | | | 257/225 |
| 2017/0109628 A1 | 4/2017 | Gokmen | |
| 2018/0095930 A1 | 4/2018 | Lu | |
| 2018/0330236 A1 | 11/2018 | Hou | |
| 2019/0296081 A1 | 9/2019 | Sharma et al. | |
| 2020/0219933 A1* | 7/2020 | Cheng | H10N 70/841 |
| 2020/0295086 A1* | 9/2020 | Iwasaki | H10B 63/84 |
| 2020/0373310 A1* | 11/2020 | Koshizawa | H10B 43/27 |
| 2021/0074717 A1* | 3/2021 | Lim | H10B 43/50 |
| 2022/0093860 A1 | 3/2022 | Loy et al. | |

FOREIGN PATENT DOCUMENTS

| | | |
|---|---|---|
| GB | 2552014 A | 1/2018 |
| JP | 55034162 A | 12/2011 |
| JP | 2023-549775 A | 11/2023 |
| WO | 2018/181019 A1 | 10/2018 |
| WO | 2022/106422 A1 | 5/2022 |

OTHER PUBLICATIONS

Cheng, et al. "Hybrid Non-Volatile Memory Cell", U.S. Appl. No. 16/949,909, filed Nov. 20, 2020.

IBM Patents or Patent Applications Treated as Related, Signed Sep. 10, 2021, 2 pages.

Eryilmaz et al. "Brain-like Associative Learning Using a Nanoscale Non-volatile Phase Change Synaptic Device Array", Frontiers in Neuroscience, Jul. 2014, 11 pages, vol. No. 8, Article 205.

Mostafa et al. "Implementation of a Spike-Based Perceptron Learning Rule Using TiO2-x Memristors", Frontiers in Neurosciences, Oct. 2015, 12 pages, vol. No. 9, Issue No. 357.

Woo et al. "Optimized Programming Scheme Enabling Linear Potentiation in Filamentary HfO2 RRAM Synapse for Neuromorphic Systems", Published in: IEEE Transactions on Electron Devices, Dec. 2016, 3 pages, vol. No. 63, Issue No. 12.

Japan Patent Office, "Notice of Reasons for Refusal," Feb. 4, 2025, 13 Pages, JP Application No. 2023-528065.

* cited by examiner

|  | PCM | ReRAM | PCM + ReRAM |
|---|---|---|---|
| SET | Gradual | abrupt | Gradual |
| RESET | abrupt | Gradual | Gradual |

HYBRID MEMORY FOR NEUROMORPHIC APPLICATIONS

BACKGROUND

The present disclosure generally relates to fabrication methods and resulting structures for semiconductor based electronic devices. More specifically, the present disclosure relates to a hybrid memory cell for neuromorphic computing.

Resistive random access memory (ReRAM) structures can be used as a type of non-volatile (NV) random-access memory (RAM) in computing resources. ReRAM devices having a simple metal-insulator-metal structure show promising characteristics in terms of scalability, low power operation, and multilevel data storage capability, and they may be suitable for next-generation memory applications. ReRAM typically operates by controlled changes in resistance across a dielectric solid-state material. The dielectric solid-state material may be referred to as a memristor. ReRAM may be considered as a promising technology for electronic synapse devices (or memristors) for neuromorphic computing as well as high-density and high-speed non-volatile memory applications. In neuromorphic computing applications, a resistive memory device can be used as a connection (synapse) between a pre-neuron and post-neuron, representing the connection weight in the form of device resistance. Multiple pre-neurons and post-neurons can be connected through a crossbar array of ReRAMs, which may enable a fully-connected neural network. Oxygen vacancies in a metal oxide layer of a ReRAM device are the building blocks of a current conducting filament. In certain ReRAM devices, a conductance change may be abrupt during a SET operation of the memory device and may be gradual during a RESET operation, thus creating an asymmetry in the conductance charge.

Phase change memory (PCM) structures are a type of memory device that is considered for analog computing. In contrast to the ReRAM devices discussed above, in certain PCM devices, a conductance change may be gradual during a SET operation of the memory device and may be abrupt during a RESET operation, thus creating an asymmetry in the conductance charge. For analog computing, it may be desired to have the conductance change gradually instead of rapidly during the RESET operation.

SUMMARY

Embodiments of the present disclosure relate to a memory device. The memory device includes a ReRAM memory element, and a PCM memory element that is electrically connected in parallel with the ReRAM memory element.

Other embodiments relate to a method of manufacturing a memory device. The method includes forming a ReRAM memory element, and forming a PCM memory element that is electrically connected in parallel with the ReRAM memory element.

The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, explain the principles of the disclosure.

The drawings are only illustrative of certain embodiments and do not limit the disclosure.

FIG. 191 is a cross-sectional view of the semiconductor device of FIG. 18 after additional fabrication operations, according to embodiments.

DETAILED DESCRIPTION

Figure 1:
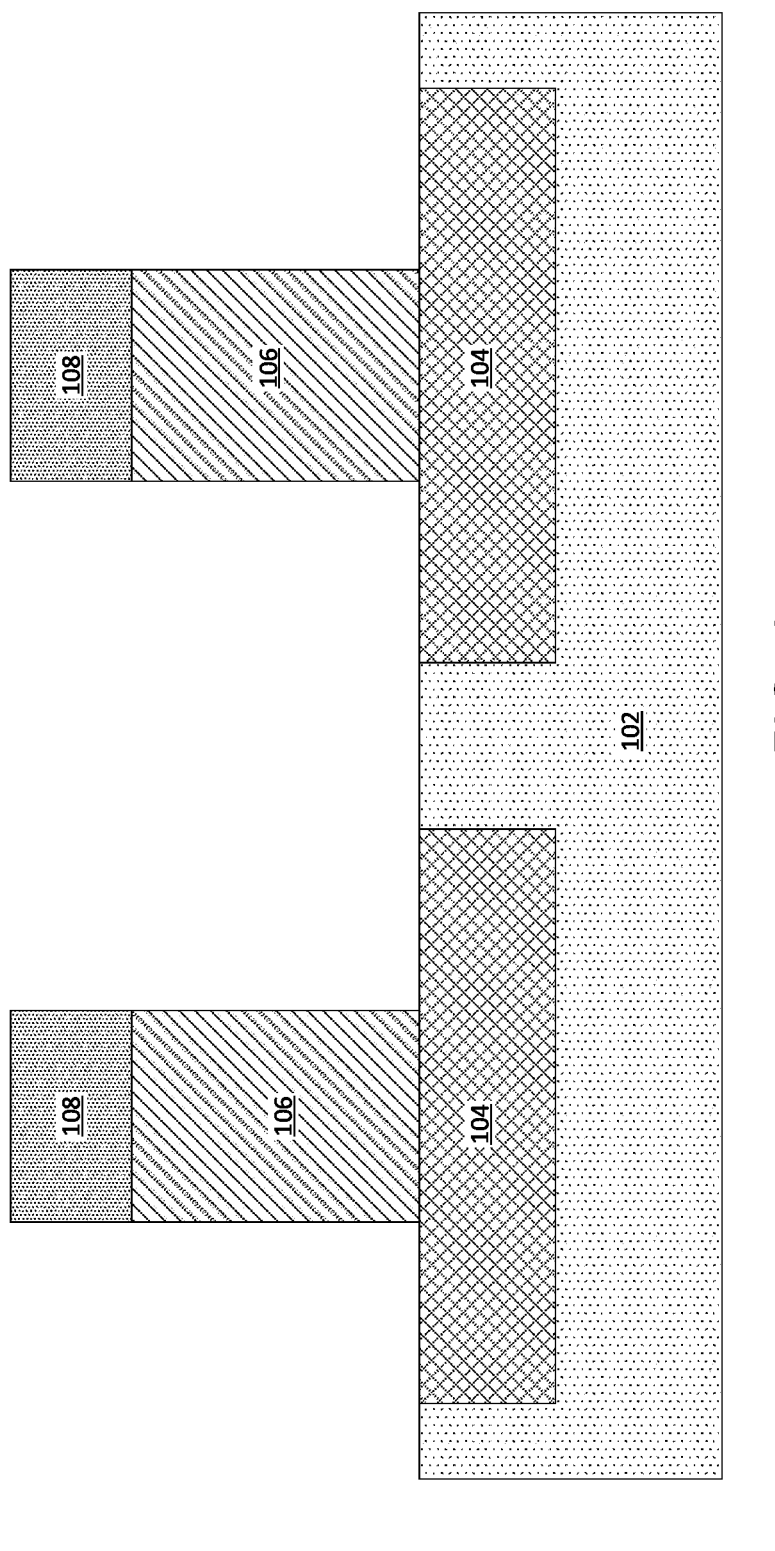
FIG. 1 is a cross-sectional view of a hybrid memory cell semiconductor device at an intermediate stage of the manufacturing process, according to embodiments.

The present disclosure generally relates to fabrication methods and resulting structures for semiconductor-based electronic devices. Certain embodiments relate to hybrid memory cells including a combination of a resistive random access memory (ReRAM) cell structure and a phase change memory (PCM) cell structure. The hybrid memory cell structure may have an integrated access transistor and a high density layout that may be used in neuromorphic computing applications. In particular, the present embodiments relate to a hybrid memory cell which includes a PCT and ReRAM in parallel. The ReRAM is bidirectional, and its conductance change is gradual during a RESET operation and is abrupt during a SET operation. In contrast, the PCM has its conductance change gradually during the SET operation and is abrupt during the RESET operation. The abrupt conductance drop of the PCM is compensated by the abrupt conductance increase of ReRAM. Thus, the total conductance change is gradual in the hybrid memory cell, according to embodiments.

The flowcharts and cross-sectional diagrams in the Figures illustrate methods of manufacturing the hybrid memory cells according to various embodiments. In some alternative implementations, the manufacturing steps may occur in a different order than that which is noted in the Figures, and certain additional manufacturing steps may be implemented between the steps noted in the Figures. Moreover, any of the layered structures depicted in the Figures may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, in neuromorphic computing applications, a resistive memory device (e.g., a ReRAM device) can be used as a connection (synapse) between a pre-neuron and post-neuron, representing the connection weight in the form of device resistance. Multiple pre-neurons and post-neurons can be connected through a crossbar array of RRAMs, which naturally expresses a fully-connected neural network. A crossbar array of RRAM can be made with junction with resistively switching material formed on the bottom electrodes. The top electrodes are formed on the junction with resistively switching material to form a crossbar array of RRAMs.

Non-volatile resistively switching metal oxides, such as $HfO_x$, $TaO_x$, $AlO_x$, $ZrO_x$, $TiO_x$, or a combination of these materials are integrated into nano-crossbar arrays and nano-cross-points scaled down to a feature size by electron beam lithography. This enables a fast fabrication route for high density prototype test structures of passive memory cores with two terminal devices. The structures and the integrated material is electrically characterized to gain an insight into the general properties of nano-crossbar arrays with resistively switching metal oxides and to define the demands for an external CMOS control system.

Nonvolatile and resistively switching materials with two or more stable states such as $HfO_x$ are integrated as two terminal memory devices to efficiently create a ReRAM bit pattern. These cells can be integrated into crossbar arrays where it reduces the cell size per bit to four. The switching material can cover the whole chip area and every junction at a cross point is an addressable cell of a ReRAM. Since the array consists of passive elements, additional active external circuitry is required for the operation to address the cells, set, and reset their state and read the stored information.

Artificial neural networks (ANNs) can be formed from crossbar arrays of resistive processing units (RPUs) that provide local data storage and local data processing without the need for additional processing elements beyond the RPU. The trainable resistive crosspoint devices are referred to as RPUs.

The neurons are integrated in CMOS circuitry with cross bar array of devices, which stores a matrix. The input neurons, along with the hidden neuron layers and output neurons and input signals. The neurons states can be, for example, backward, forward and update.

Crossbar arrays (crosspoint arrays or crosswire arrays) are high density, low cost circuit architectures used to form a variety of electronic circuits and devices, including ANN architectures, neuromorphic microchips, and ultra-high density nonvolatile memory. A basic crossbar array configuration includes a set of conductive row wires and a set of conductive column wires formed to intersect the set of conductive row wires. The intersections between the two sets of wires are separated by so-called crosspoint devices, which may be formed from thin film material. Crosspoint devices, in effect, function as the ANN's weighted connections between neurons. Nanoscales two-terminal devices, for example memristors having conduction state switching characteristics, are often used as the crosspoint devices in order to emulate synaptic plasticity with high energy efficiency. The conduction state (e.g., resistance) of the memristive material may be altered by controlling the voltages applied between individual wires of the row and column wires.

Phase-change memory (also known as PCM, PCME, PRAM, PCRAM, OUM (ovonic unified memory) and C-RAM or CRAM (chalcogenide RAM)) is a type of non-volatile random-access memory. PMCs exploit the unique behavior of chalcogenide glass. Phase change materials, such as chalcogenides, can be caused to change phase between an amorphous state and a crystalline state by application of electrical current at levels suitable for implementation in integrated circuits. The generally amorphous state is characterized by higher resistivity than the generally crystalline state, which can be readily sensed to indicate data.

Phase change materials in PCM devices are capable of being switched between a first structural state in which the material is in a generally amorphous solid phase, and a second structural state in which the material is in a generally crystalline solid phase in the active region of the cell. The term "amorphous" is used to refer to a relatively less ordered structure, more disordered than a single crystal, which has the detectable characteristics such as higher electrical resistivity than the crystalline phase. The term "crystalline" is used to refer to a relatively more ordered structure, more ordered than in an amorphous structure, which has detectable characteristics such as lower electrical resistivity than the amorphous phase. Other material characteristics affected by the change between amorphous and crystalline phases include atomic order, free electron density and activation energy. The material can be switched into either different solid phases or mixtures of two or more solid phases, providing a gray scale between completely amorphous and completely crystalline states.

The change from the amorphous to the crystalline state in PCM devices is generally a lower current operation, requiring a current that is sufficient to raise the phase change material to a level between a phase transition temperature and a melting temperature. The change from crystalline to amorphous, referred to as "reset," is generally a higher current operation, which includes a short high current density pulse to melt or break down the crystalline structure, after which the phase change material cools quickly, quenching the phase change process, thus allowing at least a portion of the phase change structure to stabilize in the amorphous state. It is desirable to minimize the magnitude of the reset current used to cause transition of phase change material from a crystalline state to an amorphous state. The magnitude of the needed reset current can be reduced by reducing the volume of the active region in the phase change material element in the cell.

Embodiments in accordance with the present disclosure provide methods and devices for employing a ReRAM based memory structure in combination (i.e., electrically in parallel) with PCM based memory devices. In certain embodiments, the ReRAM memory element is formed concentrically around the PCM memory element.

Referring now to the drawings in which like numerals represent the same or similar elements and initially to FIG. 1, an exemplary method of manufacturing a hybrid memory cell 100 to which the present embodiments may be applied is shown. As shown in FIG. 1, an underlayer 102 is formed over a base semiconductor substrate (not shown). There may be any suitable number of intermediate layers between the substrate and the underlayer 102, and in FIG. 1 the underlayer 102 is shown as the bottom layer for the sake of simplicity and ease of illustration. The underlayer 102 may be an interlayer dielectric (ILD) layer composed of, for example, $SiO_2$. However, it should be appreciated that any other suitable dielectric material or combination of materials may be used for the underlayer 102. In certain embodiments, the semiconductor substrate includes a semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), II-V compound semiconductor or another like semiconductor. In addition, multiple layers of the semiconductor materials can be used as the semiconductor material of the substrate. The semiconductor substrate can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide or nitride layer. In certain examples, the underlayer 102 is a MgO substrate. Bottom electrodes 104 are patterned and formed into the underlayer 102. As shown in FIG. 1, a thermal insulator 106 layer is formed on the bottom electrodes 104. The thermal insulator 106 layer (or dummy mandrel) may be comprised of, for example, $SiO_2$, $Al2O_3$ or any other suitable insulating material. A hardmask 108 is formed on top of the thermal insulator 106. The hardmask 108 may include at least one material, but is not limited to, materials that can be selectively removed such as silicon nitride (SixNy), silicon oxynitride (SiON), and/or silicon carbonide nitride (SiCN), and/or oxide materials such as silicon oxide (SiOx). The thermal insulator 106 and hardmask 108 may be formed as a dot (in plan view) or as any other suitable shape or cross-section. It should be appreciated that the thermal insulator 106 and the hardmask 108 may be formed through any suitable combination of material deposition, patterning and material removal processes known to one skilled in the art and as generally described above.

Figure 2:
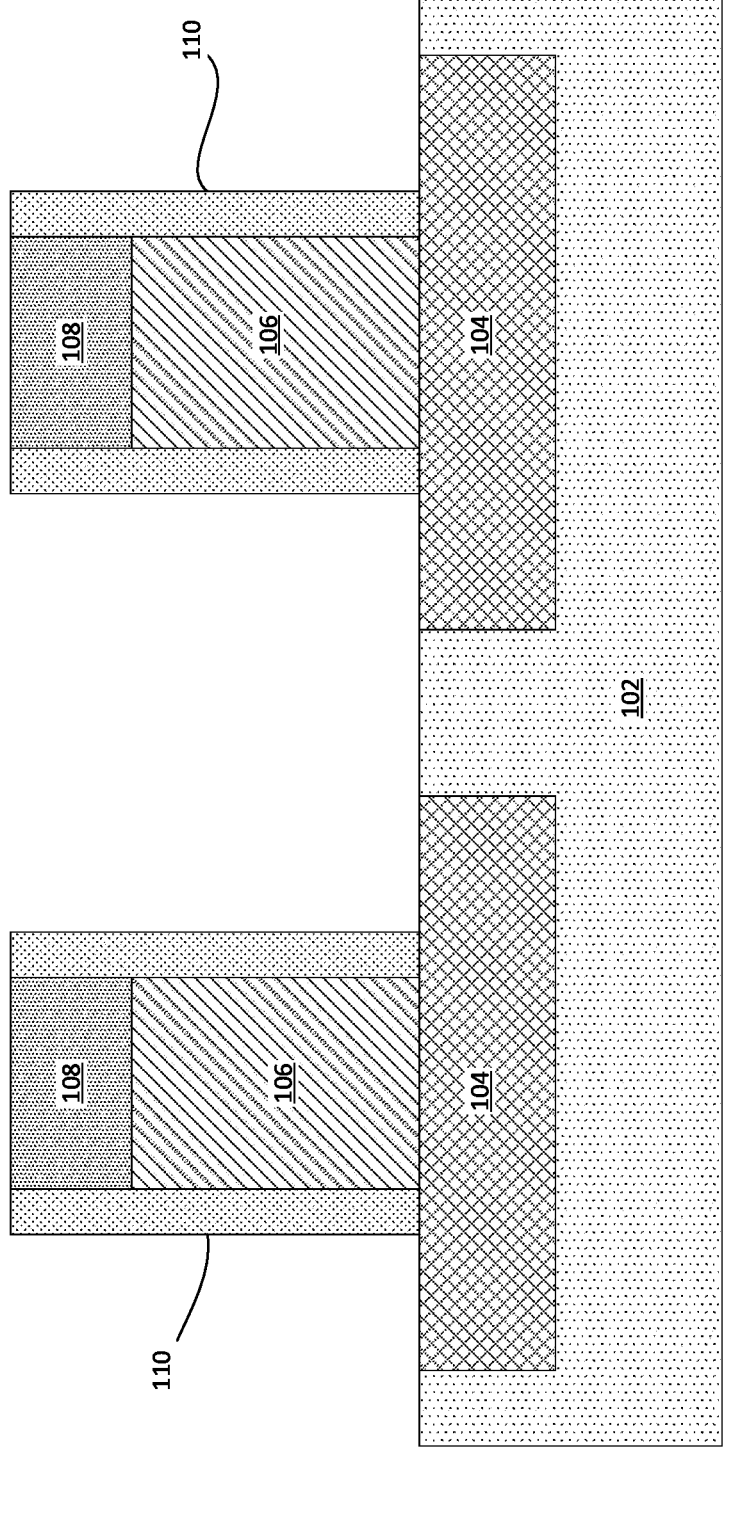
FIG. 2 is a cross-sectional view of the semiconductor device of FIG. 1 after additional fabrication operations, according to embodiments.

Referring now to FIG. 2, this figure is a cross-sectional view of the semiconductor device hybrid memory cell 100 of FIG. 1 after additional fabrication operations, according to embodiments. As shown in FIG. 2, a spacer layer 110 is formed on sidewalls of the thermal insulator 106 and the hardmask 108. The spacer layer 110 may include at least one material, but is not limited to, insulator materials such as silicon nitride (SixNy), silicon oxynitride (SiON), and/or silicon carbonide nitride (SiCN), and/or oxide materials such as silicon oxide (SiOx). In one example method of forming the spacer layer 110 it may be formed by blanket (conformal) deposition, followed by removal of horizontal portions thereof (i.e., everything but the vertical portions covering the sidewalls). It should be appreciated that the spacer 110 may be formed through any suitable combination of material deposition, patterning and material removal processes known to one skilled in the art and as generally described above.

Figure 3:
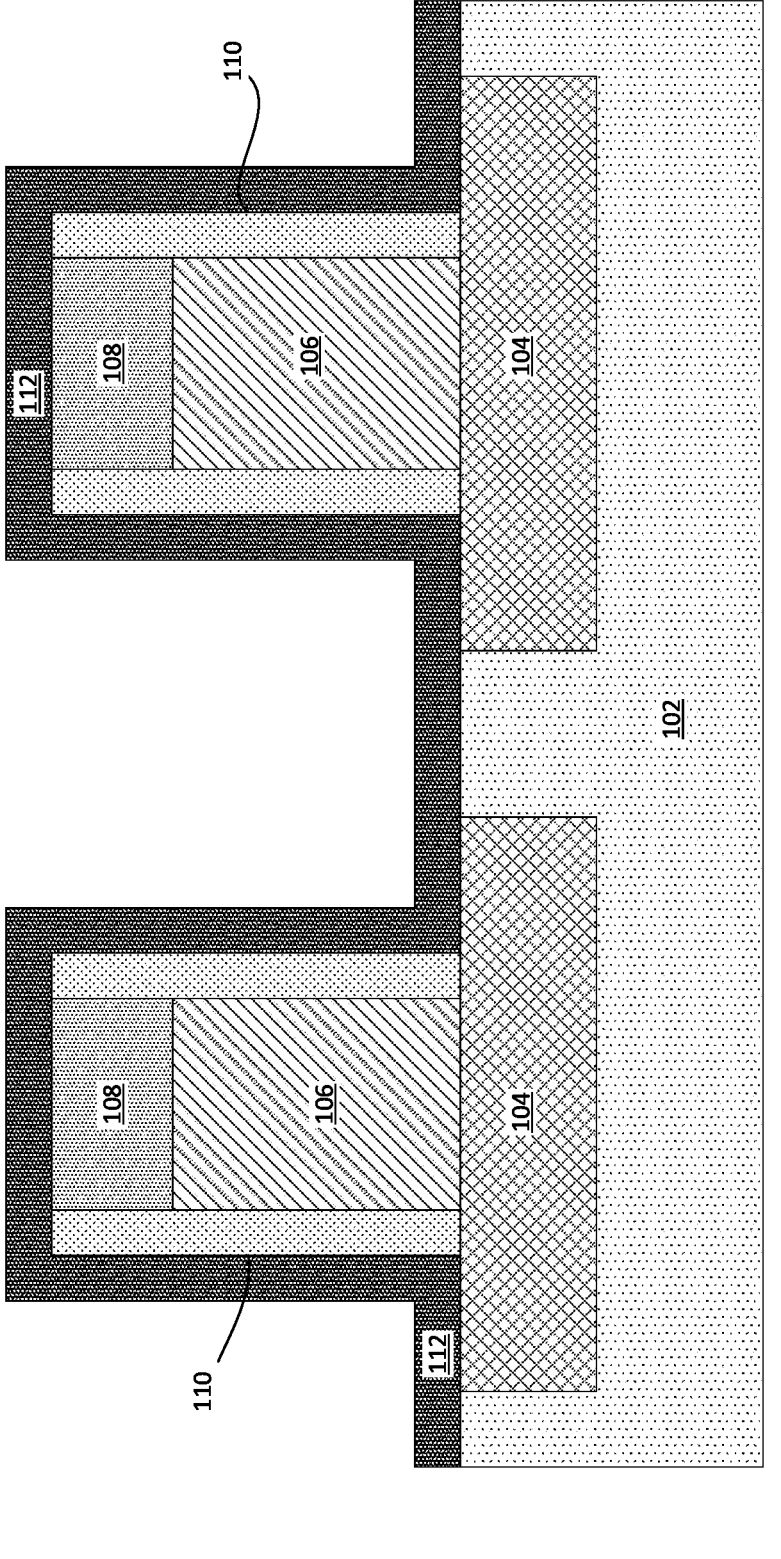
FIG. 3 is a cross-sectional view of the semiconductor device of FIG. 2 after additional fabrication operations, according to embodiments.

Referring now to FIG. 3, this figure is a cross-sectional view of the semiconductor device hybrid memory cell 100 of FIG. 2 after additional fabrication operations, according to embodiments. As shown in FIG. 3, a high-κ dielectric layer 112 is conformally formed over the entire surface of the hybrid memory cell 100. The conformal high-κ dielectric layer 112 comprises a high-κ gate dielectric material. In general, the term high-κ refers to a material with a high dielectric constant (κ, kappa), as compared to silicon dioxide. High-κ dielectrics are used in semiconductor manufacturing processes where they are usually used to replace a silicon dioxide gate dielectric or another dielectric layer of a device. In some embodiments, the high-κ dielectric layer

112 is a transitional metal oxide. Examples of materials that can be suitable for RRAM dielectric include $NiO_X$, $TiO_X$, $HfO_X$, $Ta_yO_X$, $WO_X$, $ZrO_X$, $Al_yO_X$, $SrTiO_X$,—The materials of the high-κ dielectric layer 112 may include one or more inorganic or organic materials for resistive memory cells (i.e., ReRAM).

Figure 4:
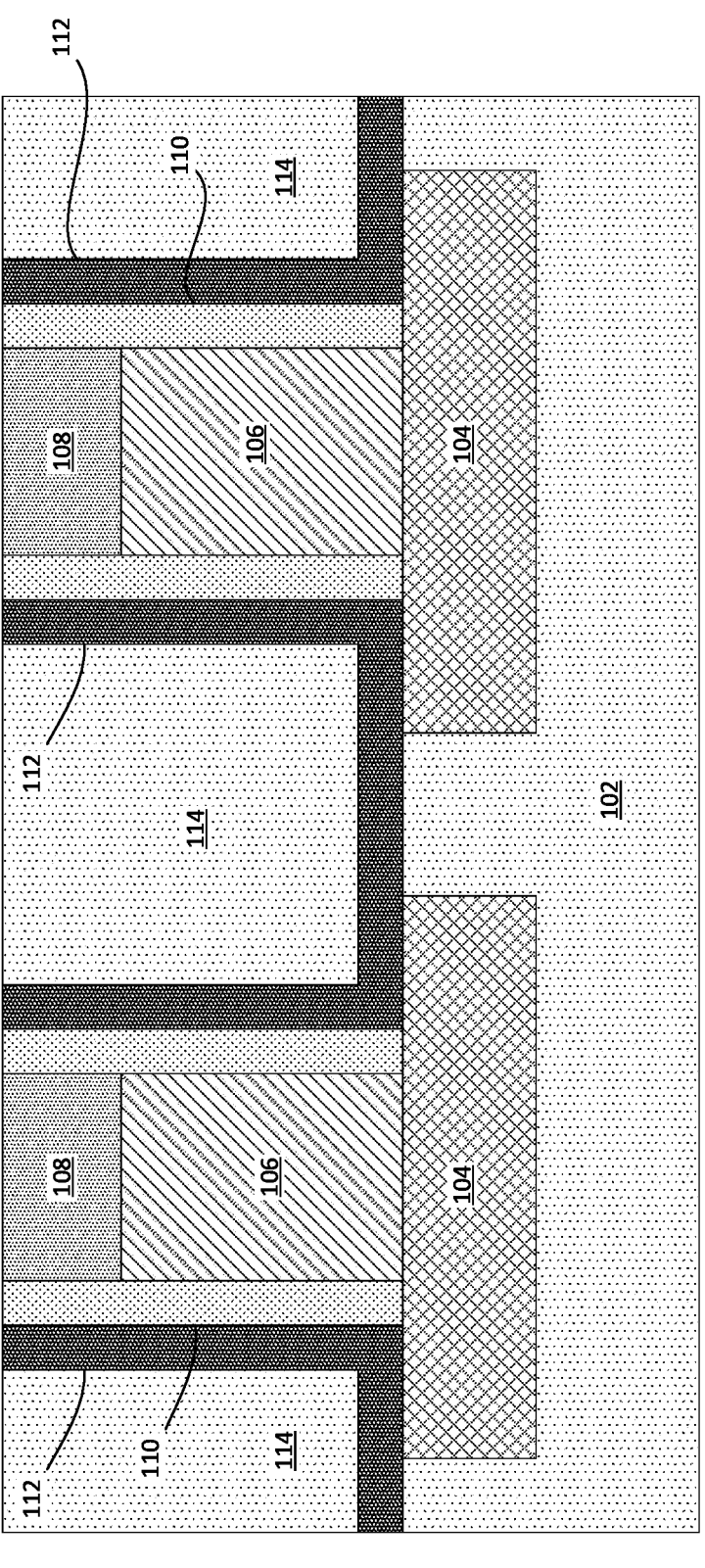
FIG. 4 is a cross-sectional view of the semiconductor device of FIG. 3 after additional fabrication operations, according to embodiments.

Referring now to FIG. 4, this figure is a cross-sectional view of the semiconductor device hybrid memory cell 100 of FIG. 3 after additional fabrication operations, according to embodiments. As shown in FIG. 4, a metal layer 114 is deposited over the high-κ dielectric layer 112. The metal layer 114 can include a stack structure of metal nitride (for example, titanium nitride, tantalum nitride, or tungsten nitride), Al-containing alloy (for example, TiAl, TiAlC, TaAl, TaAlC), titanium, tantalum, or a combination including at least one of the foregoing. Specifically, the metal layer 114 can include a stack structure of titanium nitride and TiAlC. In certain embodiments, the metal layer 114 is formed to a sufficient thickness to at least initially be at or above an upper surface of the hardmask 108. Then, the hybrid memory cell 100 device is subjected to, for example, a CMP process to planarize the supper surface thereof. Also, the CMP process removes upper portions of the high-κ dielectric layer 112 that cover the upper surfaces of the spacer 110 and the upper surfaces of the hardmask 108. In general, the CMP process is performed to remove material using the hardmask 108 as a stop.

Figure 5:
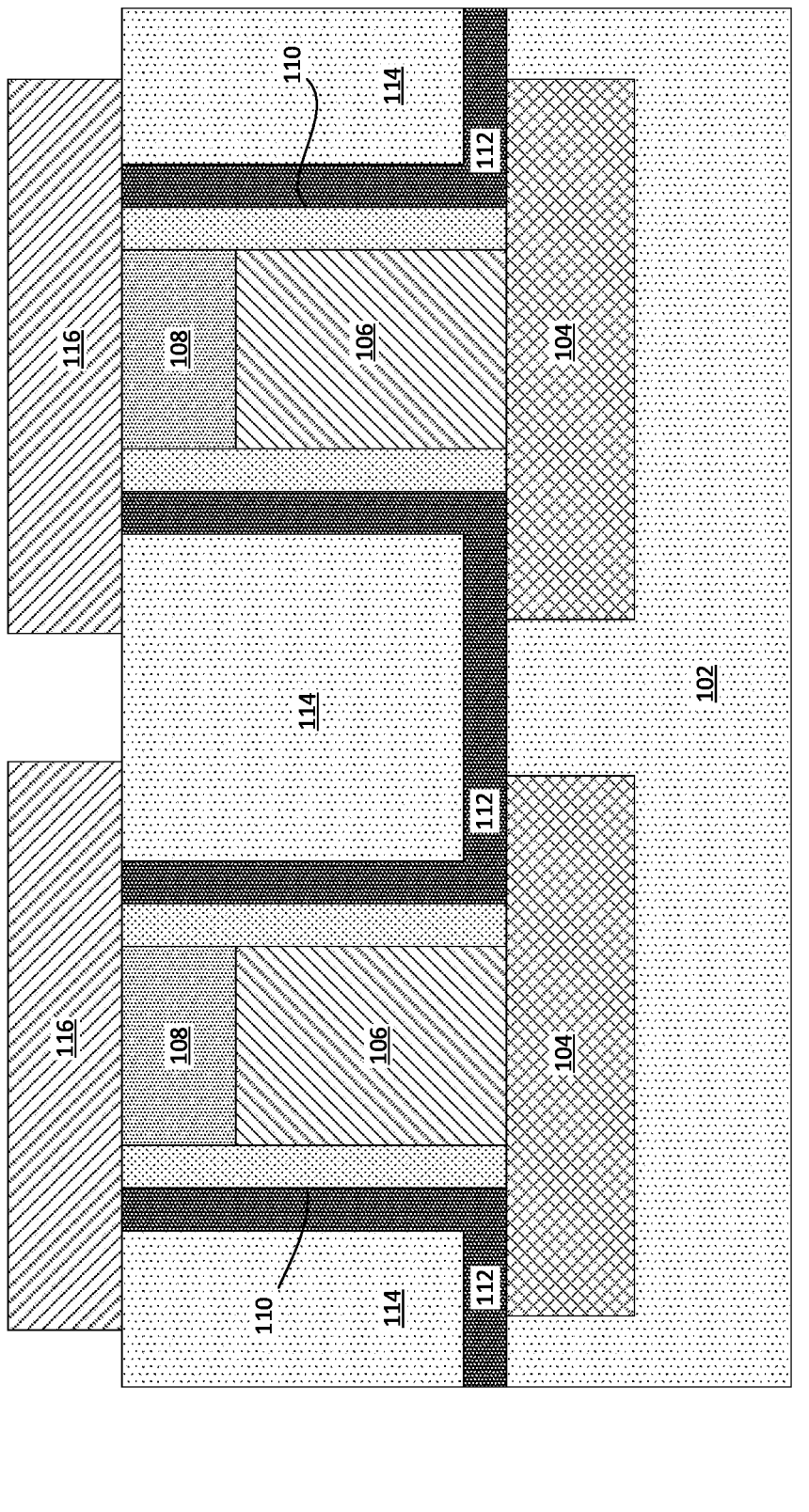
FIG. 5 is a cross-sectional view of the semiconductor device of FIG. 4 after additional fabrication operations, according to embodiments.

Referring now to FIG. 5, this figure is a cross-sectional view of the semiconductor device hybrid memory cell 100 of FIG. 4 after additional fabrication operations, according to embodiments. As shown in FIG. 5, a mask 116 is formed (i.e., patterned) over the hardmask 108, the spacer 110, the high-κ dielectric layer 112, and over portions of the metal layer 114. The mask 116 may include at least one material, but is not limited to, insulator materials such as silicon nitride ($Si_xN_y$), silicon oxynitride (SiON), and/or silicon carbon nitride (SiCN), and/or oxide materials such as silicon oxide ($SiO_x$). It should be appreciated that the mask 116 may be patterned by any suitable combination of material deposition, patterning, and material removal processes known to one skilled in the art and as generally described above. The openings in the mask 116 will allow for subsequent removal of portions of the underlying metal layer 114 and high-κ dielectric layer 112.

Figure 6:
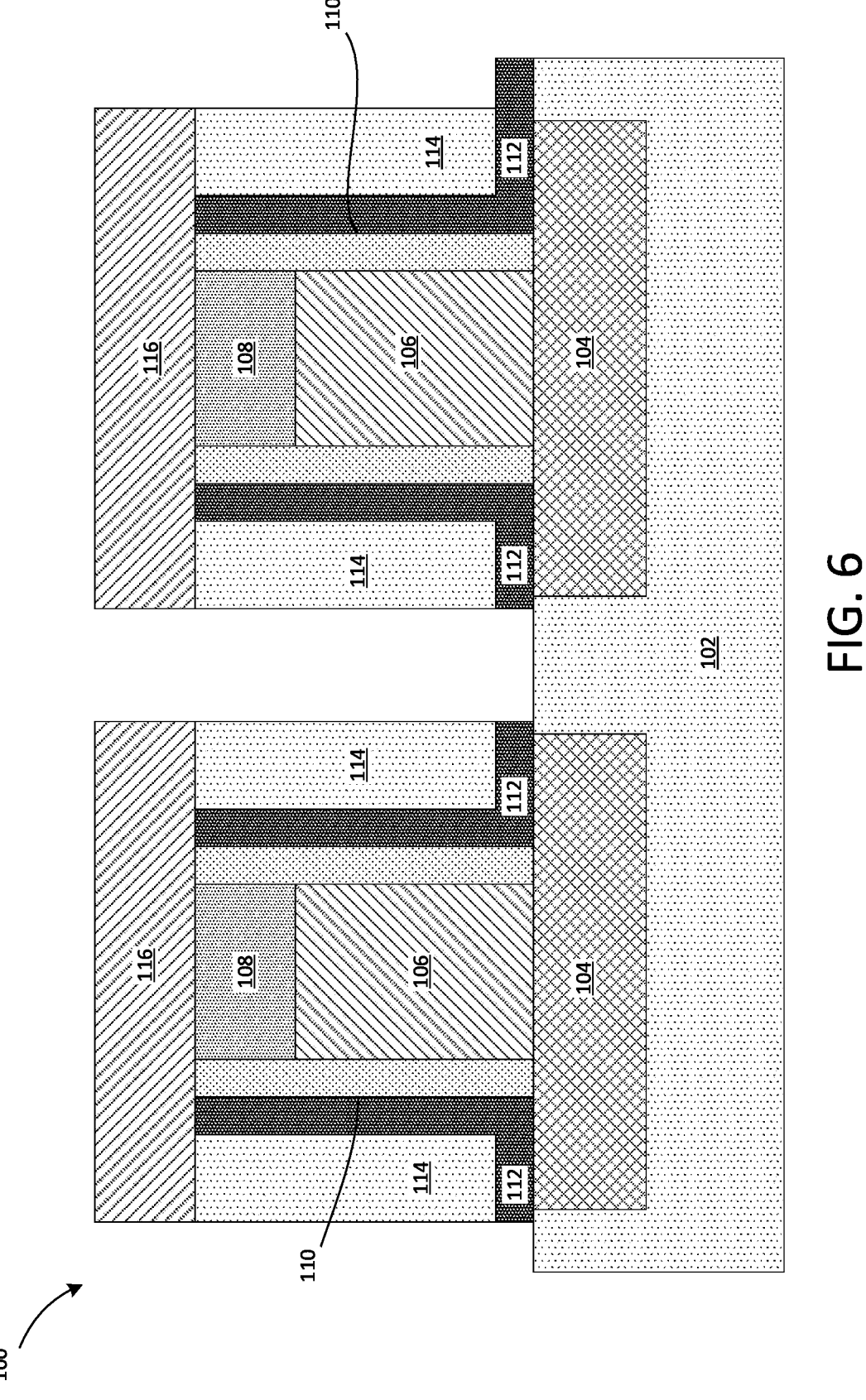
FIG. 6 is a cross-sectional view of the semiconductor device of FIG. 5 after additional fabrication operations, according to embodiments.

Referring now to FIG. 6, this figure is a cross-sectional view of the semiconductor device hybrid memory cell 100 of FIG. 5 after additional fabrication operations, according to embodiments. As shown in FIG. 6, after the formation of the mask 116, a reactive ion etching (RIE) process is performed to remove the metal layer 114 and the high-κ dielectric layer 112 in the opening portions of the mask 116. In one example, the mask 116 may be a combination of photoactive resist material and dielectric (or hardmask) materials. In this example, the mask 116 may include a plurality of sublayers of different materials or it may include only a single layer.

Figure 7:
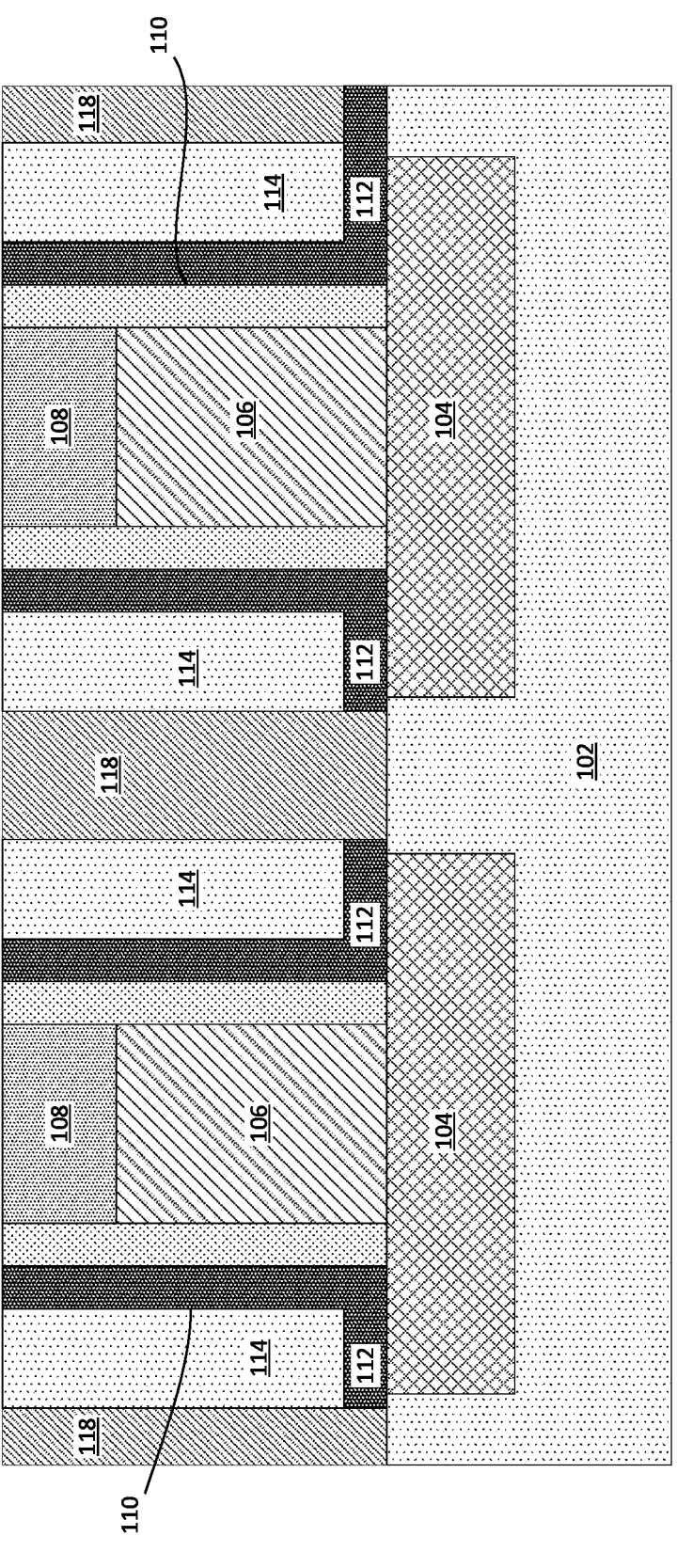
FIG. 7 is a cross-sectional view of the semiconductor device of FIG. 6 after additional fabrication operations, according to embodiments.

Referring now to FIG. 7, this figure is a cross-sectional view of the semiconductor device hybrid memory cell 100 FIG. 6 after additional fabrication operations, according to embodiments. As shown in FIG. 7, an interlayer dielectric (ILD) layer 118 is deposited in the openings created by the previous RIE process discussed above with respect to FIG. 6. Suitable ILD materials include, but are not limited to, oxide low-κ materials such as silicon oxide (SiOx), SiOCH, and/or oxide ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH). A process such as CVD, ALD or PVD can be employed to deposit ILD 150 around the hybrid memory cell. Following deposition, ILD layer 118 can be planarized using a process such as chemical mechanical polishing (CMP) remove any excess material of the ILD layer 118 and to planarize the top surface of the hybrid memory cell 100. As in the previous CMP process, the hardmask 108 is used as a stopping point for the CMP process. Also, the entirety of the mask 116 is removed in the CMP process.

Figure 8:
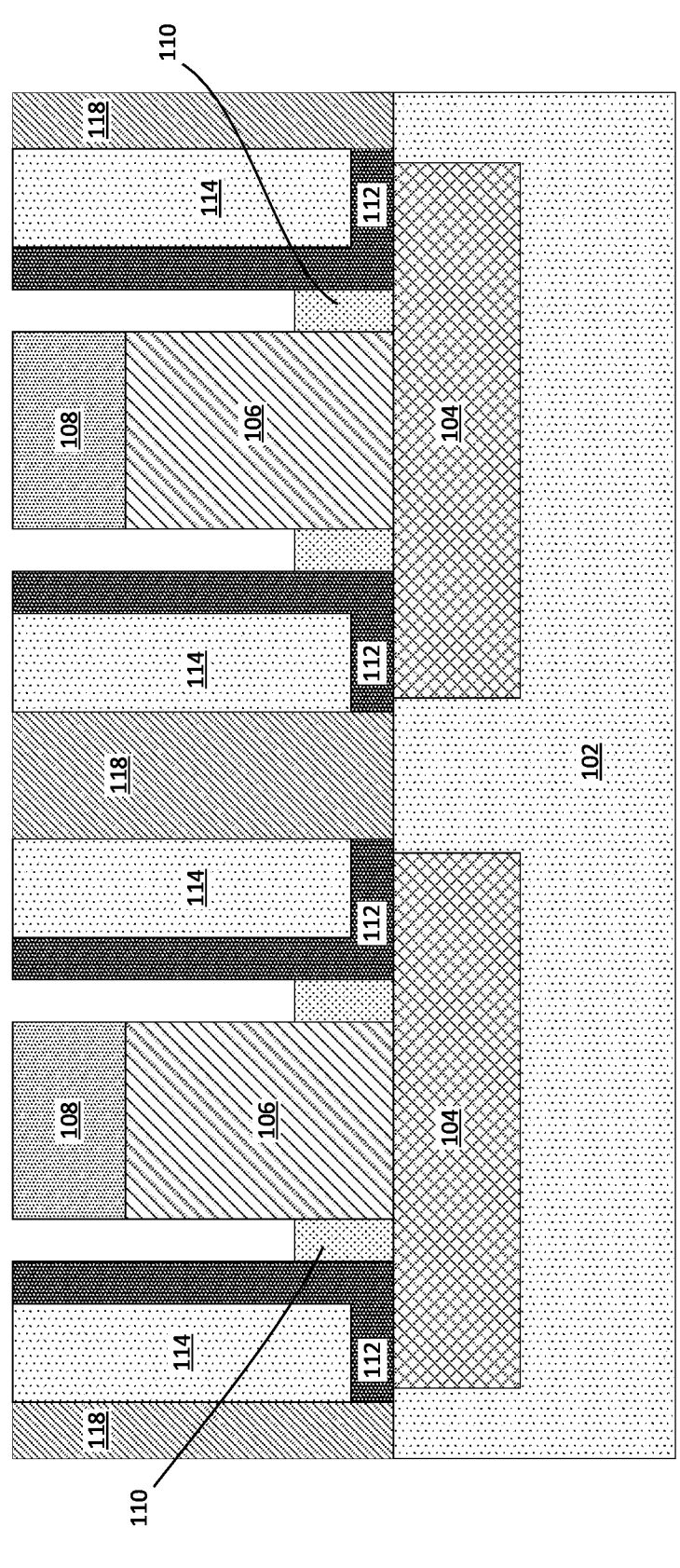
FIG. 8 is a cross-sectional view of the semiconductor device of FIG. 7 after additional fabrication operations, according to embodiments.

Referring now to FIG. 8, this figure is a cross-sectional view of the semiconductor device hybrid memory cell 100 of FIG. 7 after additional fabrication operations, according to embodiments. As shown in FIG. 8, an etching process is performed to recess the spacer 110. It should be appreciated that the etching process may be an isotropic etching process that is configured so that there is a selectivity between the material of the spacer 110 layer and the materials of the other layers (e.g., the ILD layer 118, the metal layer 114, the high-κ dielectric layer 112 and the hardmask 108), so that the material of the spacer 110 layer may be removed without significantly removing portions of the other layers.

Figure 9:
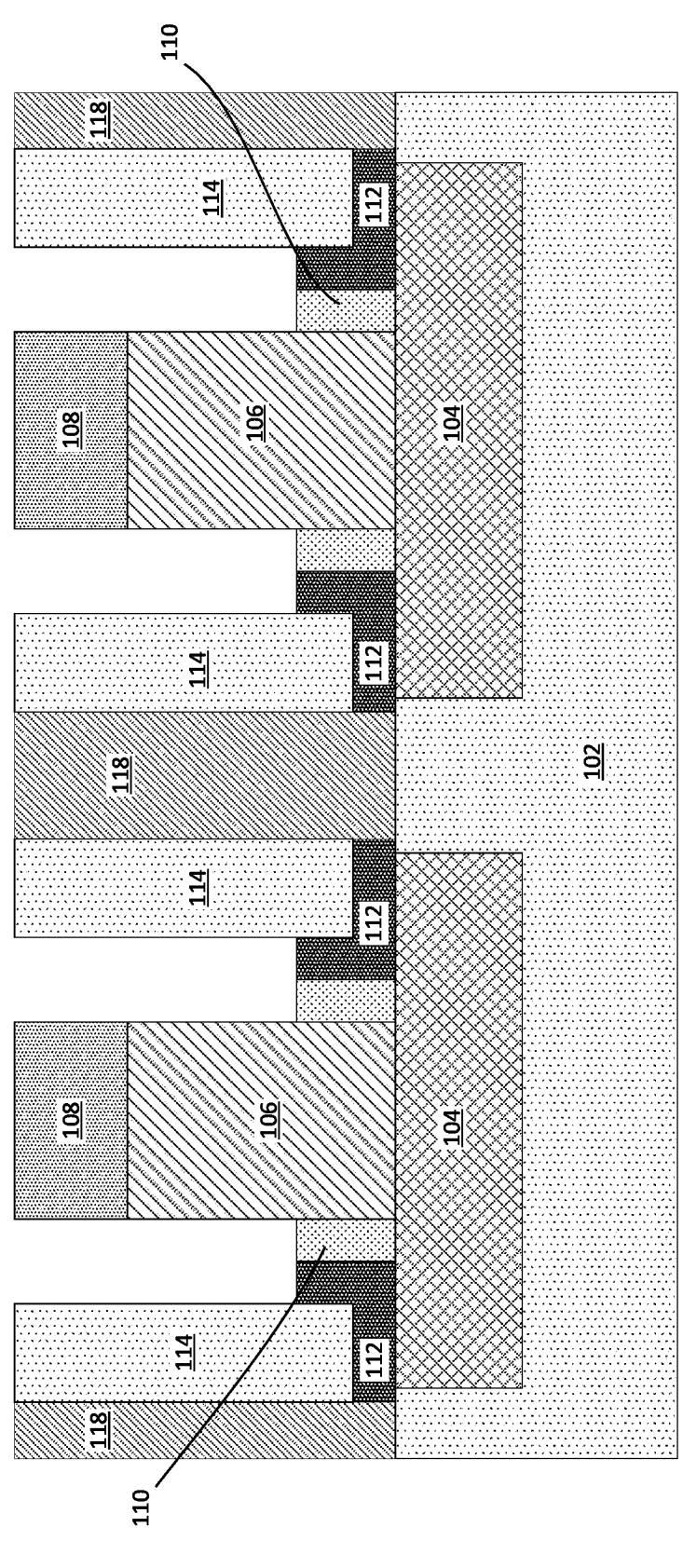
FIG. 9 is a cross-sectional view of the semiconductor device of FIG. 8 after additional fabrication operations, according to embodiments.

Referring now to FIG. 9, this figure is a cross-sectional view of the semiconductor device hybrid memory cell 100 of FIG. 8 after additional fabrication operations, according to embodiments. As shown in FIG. 9, another etching process is performed to recess the high-κ dielectric layer 112. It should be appreciated that the etching process may be an isotropic etching process that is configured so that there is a selectivity between the material of the high-κ dielectric layer 112 and the materials of the other layers (e.g., the ILD layer 118, the metal layer 114, the spacer 110 layer and the hardmask 108), so that the material of the high-κ dielectric layer 110 layer may be removed without significantly removing portions of the other layers.

Figure 10:
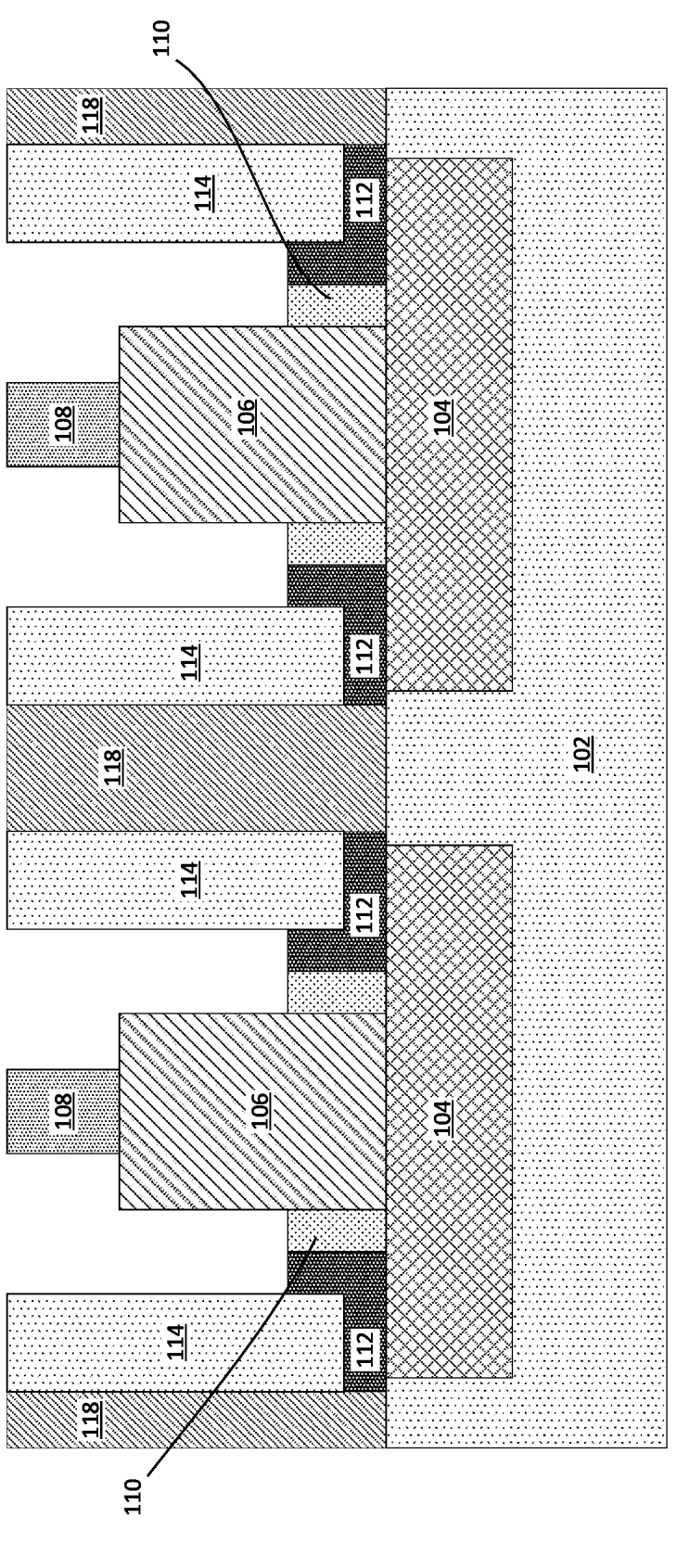
FIG. 10 is a cross-sectional view of the semiconductor device of FIG. 9 after additional fabrication operations, according to embodiments.

Referring now to FIG. 10, this figure is a cross-sectional view of the semiconductor device hybrid memory cell 100 of FIG. 9 after additional fabrication operations, according to embodiments. As shown in FIG. 10, yet another etching process is performed to remove (or shrink) portions of the hardmask 108 layer. It should be appreciated that the etching process may be an isotropic etching process that is configured so that there is a selectivity between the material of the hardmask 108 layer and the materials of the other layers (e.g., the ILD layer 118, the metal layer 114, the spacer 110 layer and the high-κ dielectric layer 112), so that the material of the high-κ dielectric layer 112 layer may be removed without significantly removing portions of the other layers. Thus, as described above with respect to FIGS. 8-10, there are three separate etching processes performed to remove portions of the spacer 110, the high-κ dielectric layer 112 and the hardmask 108 layer.

Figure 11:
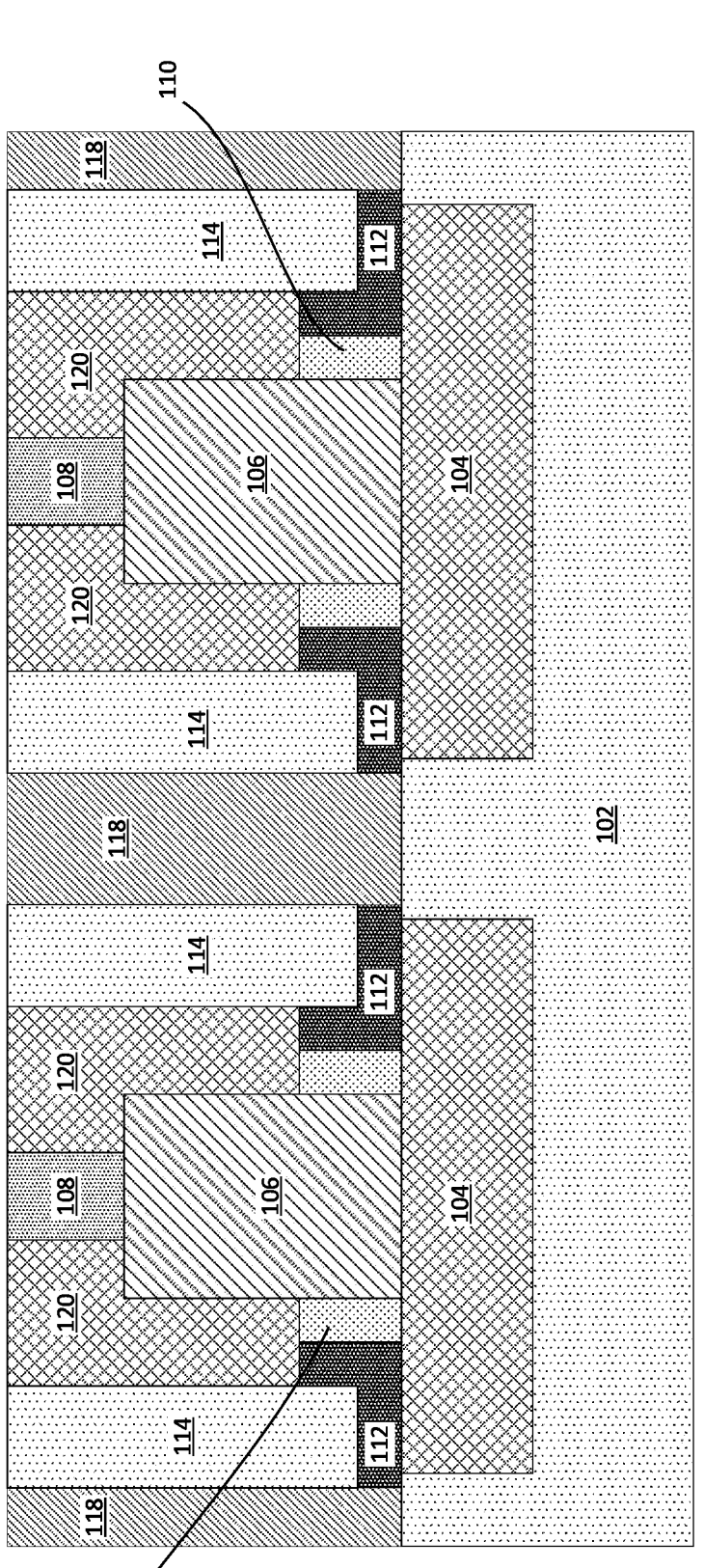
FIG. 11 is a cross-sectional view of the semiconductor device of FIG. 10 after additional fabrication operations, according to embodiments.

Referring now to FIG. 11, this figure is a cross-sectional view of the semiconductor device hybrid memory cell 100 of FIG. 10 after additional fabrication operations, according to embodiments. As shown in FIG. 11, a second dielectric layer 120 is deposited in the gaps formed by the removal of the portions of the spacer 110, the high-κ dielectric layer 112 and the hardmask 108 layer that is described above with respect to FIGS. 8-10. In certain examples, a CMP process is once again performed to remove any excess material of the second dielectric layer 120 and to planarize the top surface of the hybrid memory cell 100. As in the previous CMP process, the remaining portions of the hardmask 108 are used as a stopping point for the CMP process.

Figure 12:
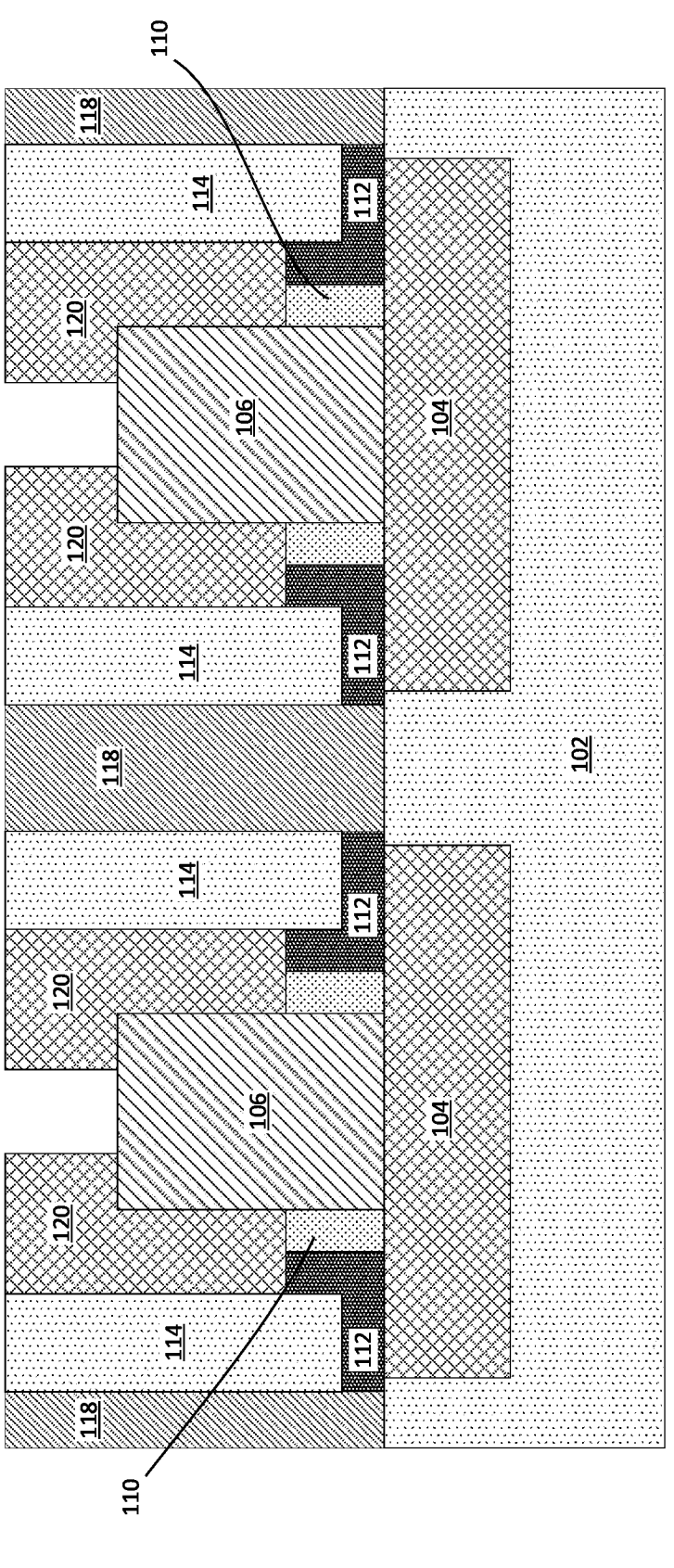
FIG. 12 is a cross-sectional view of the semiconductor device of FIG. 11 after additional fabrication operations, according to embodiments.

Referring now to FIG. 12, this figure is a cross-sectional view of the semiconductor device hybrid memory cell 100 of FIG. 11 after additional fabrication operations, according to embodiments. As shown in FIG. 12, a material removal process (e.g., isotropic etching or RIE) is used to remove all (or at least substantially all) of the remaining portions of the hardmask 108 layer, and to expose the upper surface of the thermal insulator 106 layer (or dummy mandrel).

Figure 13:
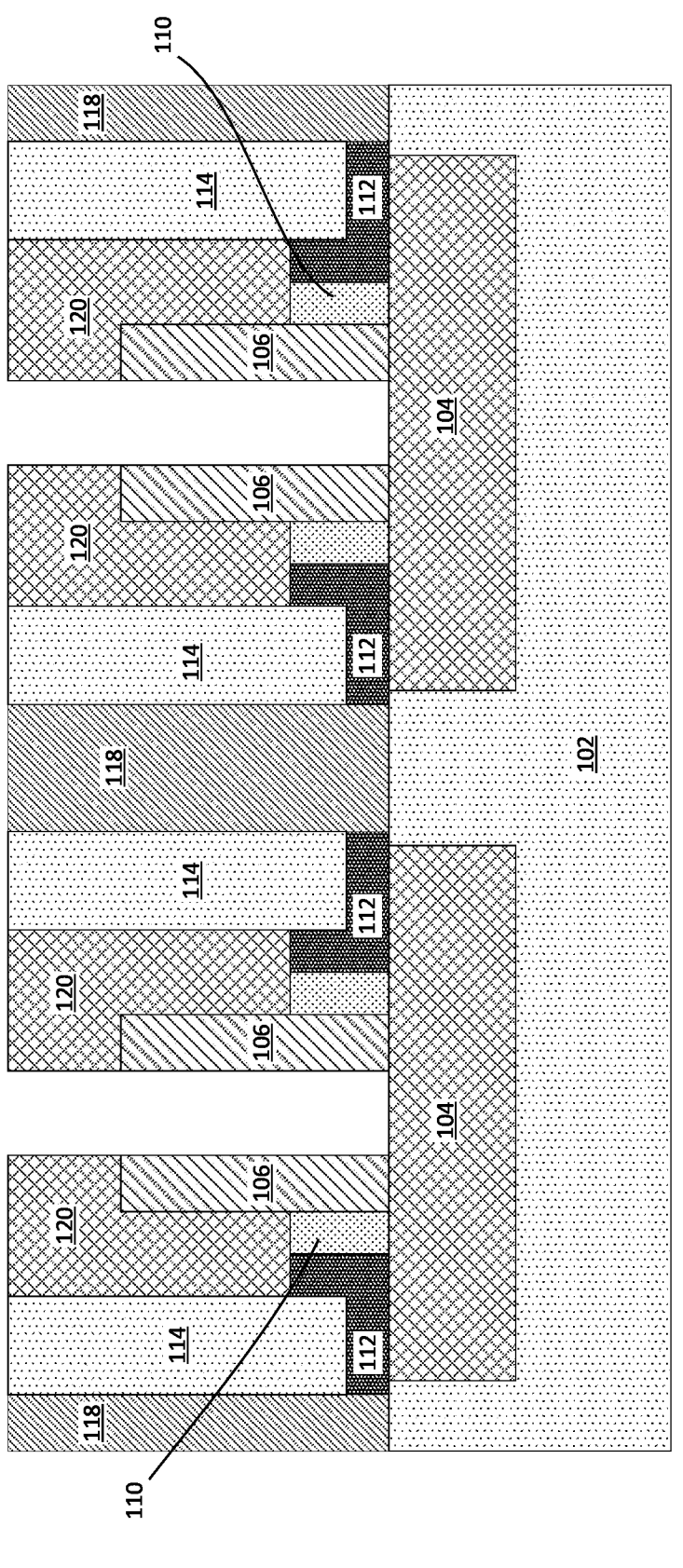
FIG. 13 is a cross-sectional view of the semiconductor device of FIG. 12 after additional fabrication operations, according to embodiments.

Referring now to FIG. 13, this figure is a cross-sectional view of the semiconductor device hybrid memory cell 100 of FIG. 12 after additional fabrication operations, according to embodiments. As shown in FIG. 13, an anisotropic etching process (i.e., a directional etch) is performed to remove the exposed portions of the thermal insulator 106 layer down to the level of the bottom electrodes 104. That is, due to the anisotropic etching, the thermal insulator 106 is removed only in the vertical direction.

Figure 14:
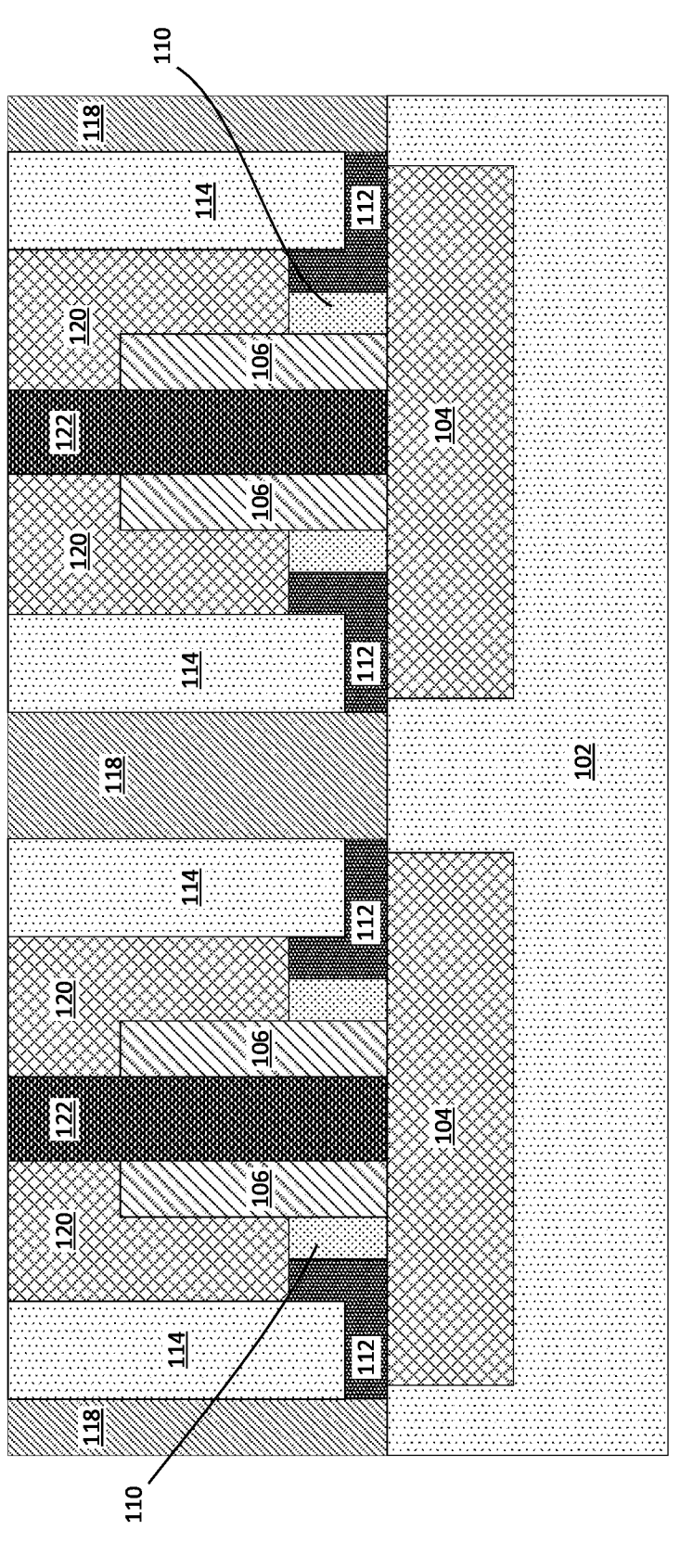
FIG. 14 is a cross-sectional view of the semiconductor device of FIG. 13 after additional fabrication operations, according to embodiments.
Figure 15:
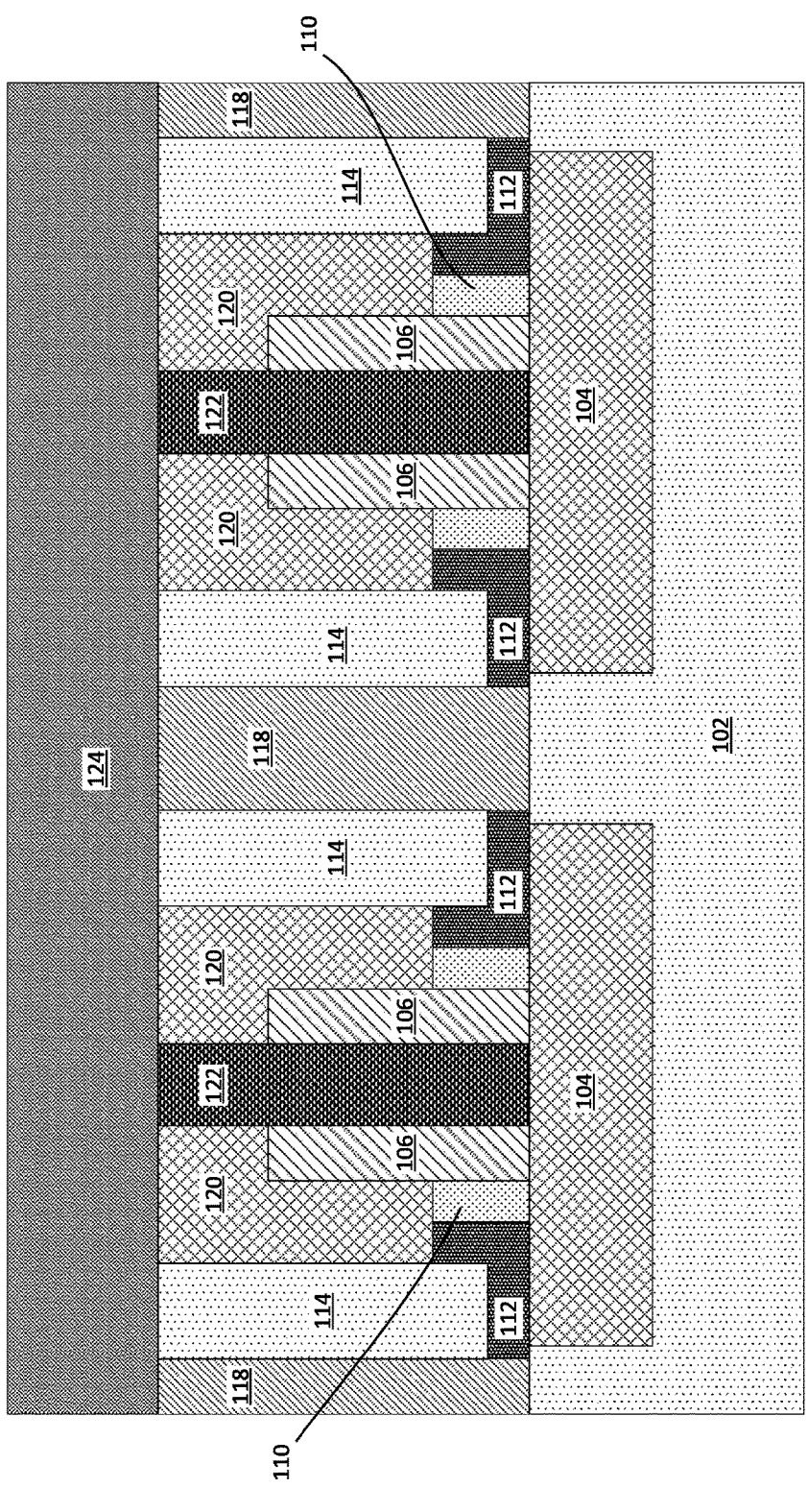
FIG. 15 is a cross-sectional view of the semiconductor device of FIG. 14 after additional fabrication operations, according to embodiments.

Referring now to FIG. 14, this figure is a cross-sectional view of the semiconductor device hybrid memory cell 100 of FIG. 13 after additional fabrication operations, according to embodiments. Thus, due the previous step of shrinking the hardmask 108 layer, the formation of the second dielectric layer 120 and the removal of the hardmask 108 layer described above with regard to FIG. 10, a middle portion of the thermal insulator 106 may be removed. As shown in FIG. 14, a TiN layer 122 is deposited to form a heater of the phase change memory (PCM) portion of the hybrid memory cell 100. In certain PCM memory devices, heat produced by the passage of an electric current through a heating element (i.e., the TiN layer 122) generally made of titanium nitride may be used to either quickly heat and quench the glass (e.g., the GST layer shown in FIG. 15), making it amorphous, or to hold it in its crystallization temperature range for some time, thereby switching it to a crystalline state. In certain embodiments, Referring now to FIG. 15, this figure is a cross-sectional view of the semiconductor device hybrid memory cell 100 of FIG. 14 after additional fabrication operations, according to embodiments. As shown in FIG. 15, a phase change layer 124 is formed over the entire surface of the hybrid memory cell 100. In general, phase-change memories (PCMs) are based on the peculiar properties of chalcogenide materials, that is, compounds based on sulfur, selenium, or tellurium, such as GeSe, AsS, SbTe and $In_2Se_3GeAsTe$, or GeSbTe (GST). The latter is the most frequently used material in PCMs such as in the phase change layer 124 shown in FIG. 15. The phase change material can include a Ge—Sb—Te (germanium-antimony-tellurium or "GST", such as $Ge_2Sb_2Te_5$) alloy. Alternatively, other suitable materials for the phase change material include Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, and combinations thereof. In some embodiments, the phase change material can further include nitrogen, carbon, and/or oxygen. In some embodiments, the phase change material can be doped with dielectric materials including but not limited to aluminum oxide ($Al_2O_3$), silicon oxide ($SiO_2$), (Tantalum oxide ($Ta_2O_5$), hafnium oxide ($HfO_2$), zirconium oxide ($ZrO_2$), cerium Oxide ($CeO_2$), silicon nitride (SiN), silicon oxynitride (SiON), etc. The phase change material of the phase change layer 124 can be deposited utilizing physical vapor deposition (PVD), magnetron-assisted sputtering, chemical vapor deposition (CVD), atomic layer deposition (ALD), evaporation, ion beam deposition, electron beam deposition, laser assisted deposition, chemical solution deposition, or any other suitable deposition techniques. After deposition, the phase change material can be planarized, for example, by chemical mechanical polish (CMP), Memory switching in these materials is primarily a thermal process, which involves a phase transformation from a crystalline to an amorphous state, and vice versa, under the influence of a heat source (i.e., the TiN layer 122 or the heater). When the heating process stops, the material of the phase change layer 124 retains its new state, thus exhibiting memory (the SET operation). In practice, this transformation is achieved by passing a constant current through the sample for some time. The transition to an amorphous state (the RESET operation) occurs by resistive heating up to the local melting of the phase change layer 124. To switch back to the low resistance crystalline state (the SET operation), a lower and longer pulse may be applied. The resistance change between the two states is ~2-3 orders of magnitude, so that reading can easily be accomplished by low-bias nondestructive detection of the cell resistance.

Figure 16:
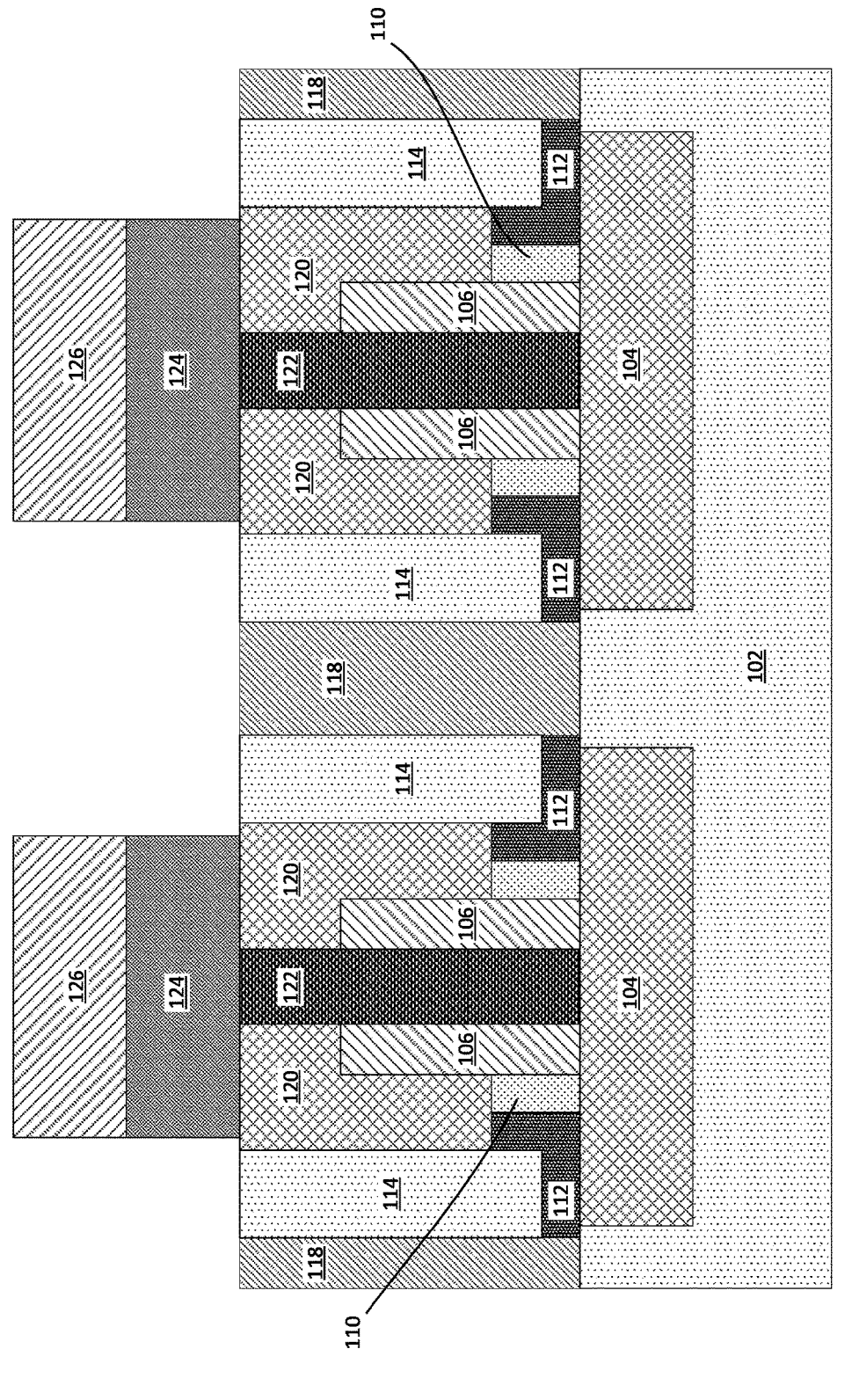
FIG. 16 is a cross-sectional view of the semiconductor device of FIG. 15 after additional fabrication operations, according to embodiments.

Referring now to FIG. 16, this figure is a cross-sectional view of the semiconductor device hybrid memory cell 100 of FIG. 15 after additional fabrication operations, according to embodiments. As shown in FIG. 16, a GST mask 126 is formed on top of the phase change layer 124, and this GST mask 126 is used to pattern the phase change layer 124 into discrete islands. It should be appreciated that although in one example the plan view (i.e., top down view) of the phase change layer 124 may be formed into circular (or cylindrical) islands, other shapes or configurations are possible.

Figure 17:
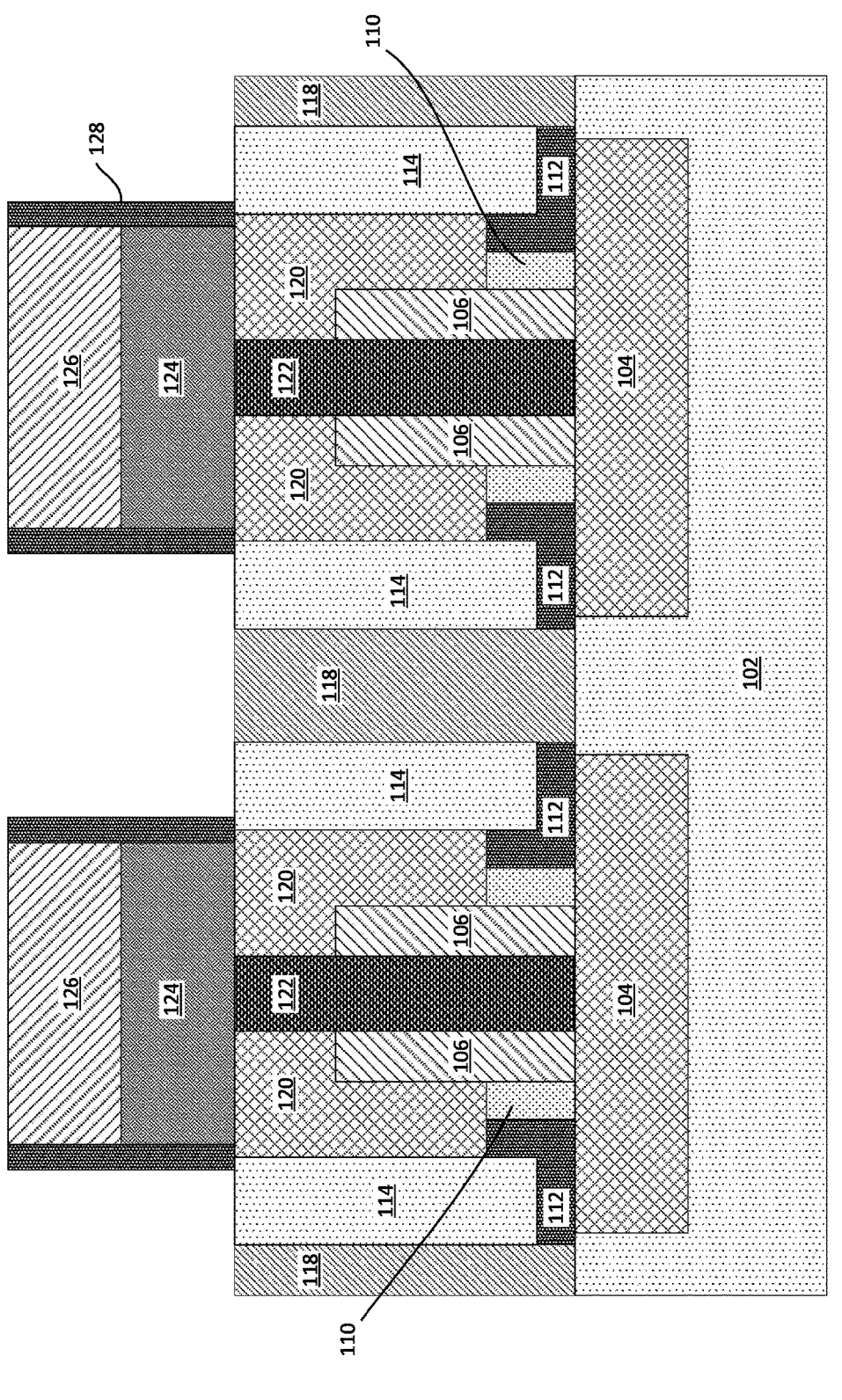
FIG. 17 is a cross-sectional view of the semiconductor device of FIG. 16 after additional fabrication operations, according to embodiments.

Referring now to FIG. 17, this figure is a cross-sectional view of the semiconductor device hybrid memory cell 100 of FIG. 16 after additional fabrication operations, according to embodiments. As shown in FIG. 17, a liner layer 128 (or spacer) is formed or deposited on the sidewalls of the phase change layer 124 and the GST mask 126. The liner layer 128 may be a nitride based layer, for example. In one example, the liner layer 128 layer is first conformally deposited over the entire surface of the hybrid memory cell 100, and then horizontal portions thereof (i.e., the portions covering the top surfaces of the GST mask 126, the metal layer 114 and the ILD layer 118) are removed with a RIE operation.

Figure 18:
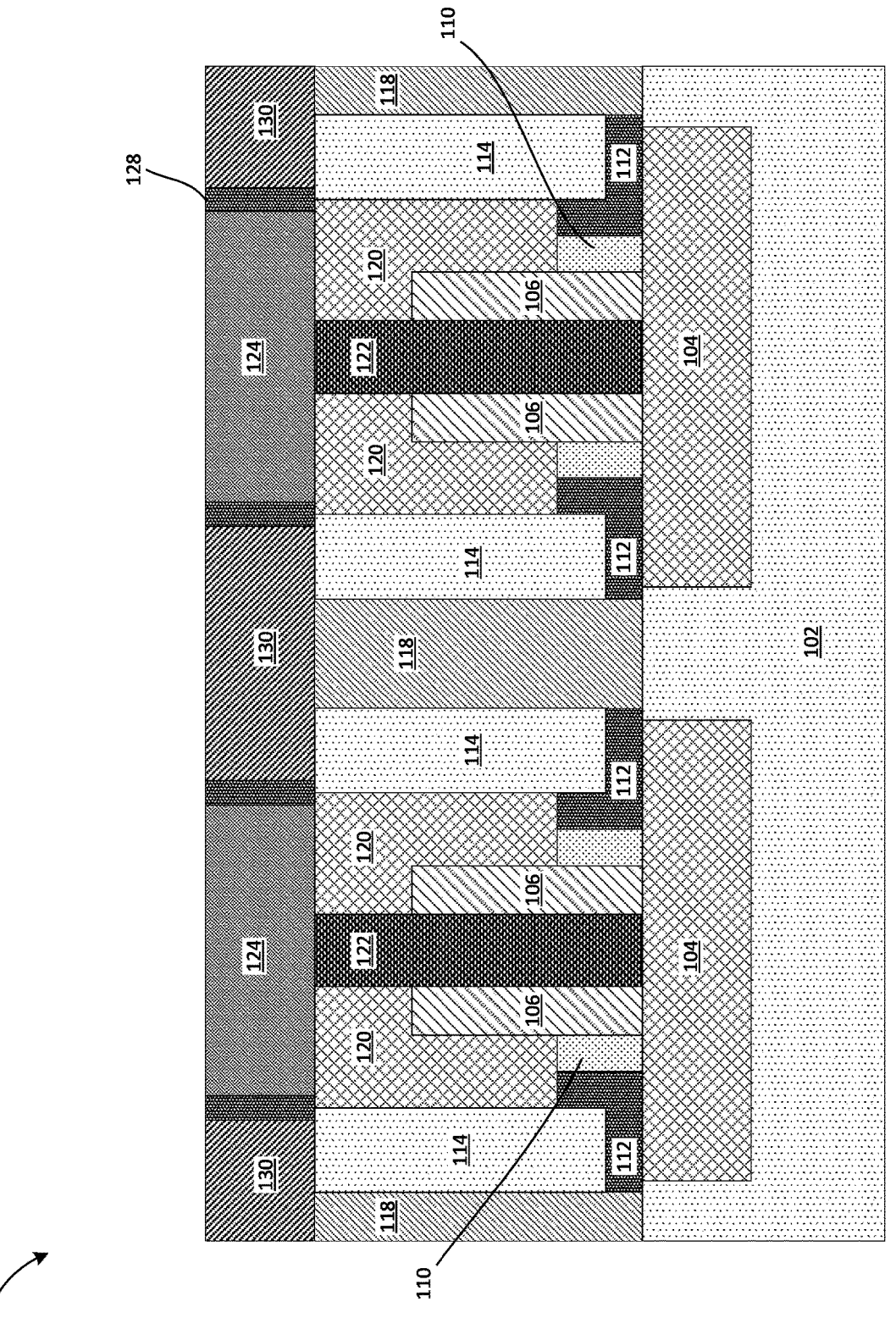
FIG. 18 is a cross-sectional view of the semiconductor device of FIG. 17 after additional fabrication operations, according to embodiments.

Referring now to 18, this figure is a cross-sectional view of the semiconductor device hybrid memory cell 100 of FIG. 17 after additional fabrication operations, according to embodiments. As shown in FIG. 18, after the formation of the liner layer 128, a second ILD layer 130 is deposited over the entire surface of the hybrid memory cell 100, and then a CMP process is performed to planarize the upper surface and to remove the GST mask 126. Thus, the phase change layer 124 is a stopping point for the CMP process.

Figure 19:
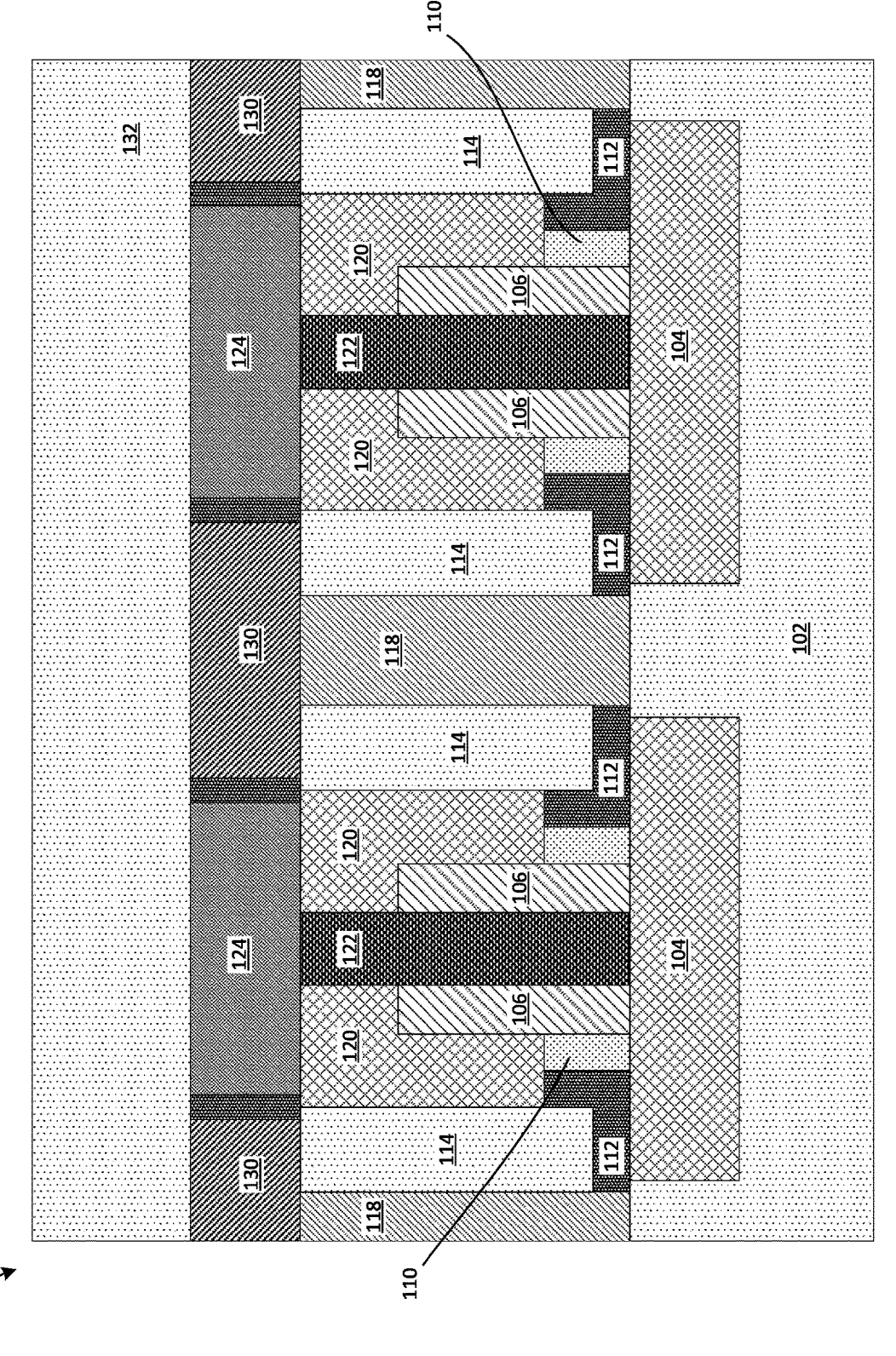

Referring now to FIG. 19, this figure is a cross-sectional view of the semiconductor device hybrid memory cell 100 of FIG. 18 after additional fabrication operations, according to embodiments. As shown in FIG. 19, a third ILD layer 132 is formed over the entire surface of the hybrid memory cell 100.

Figure 20:
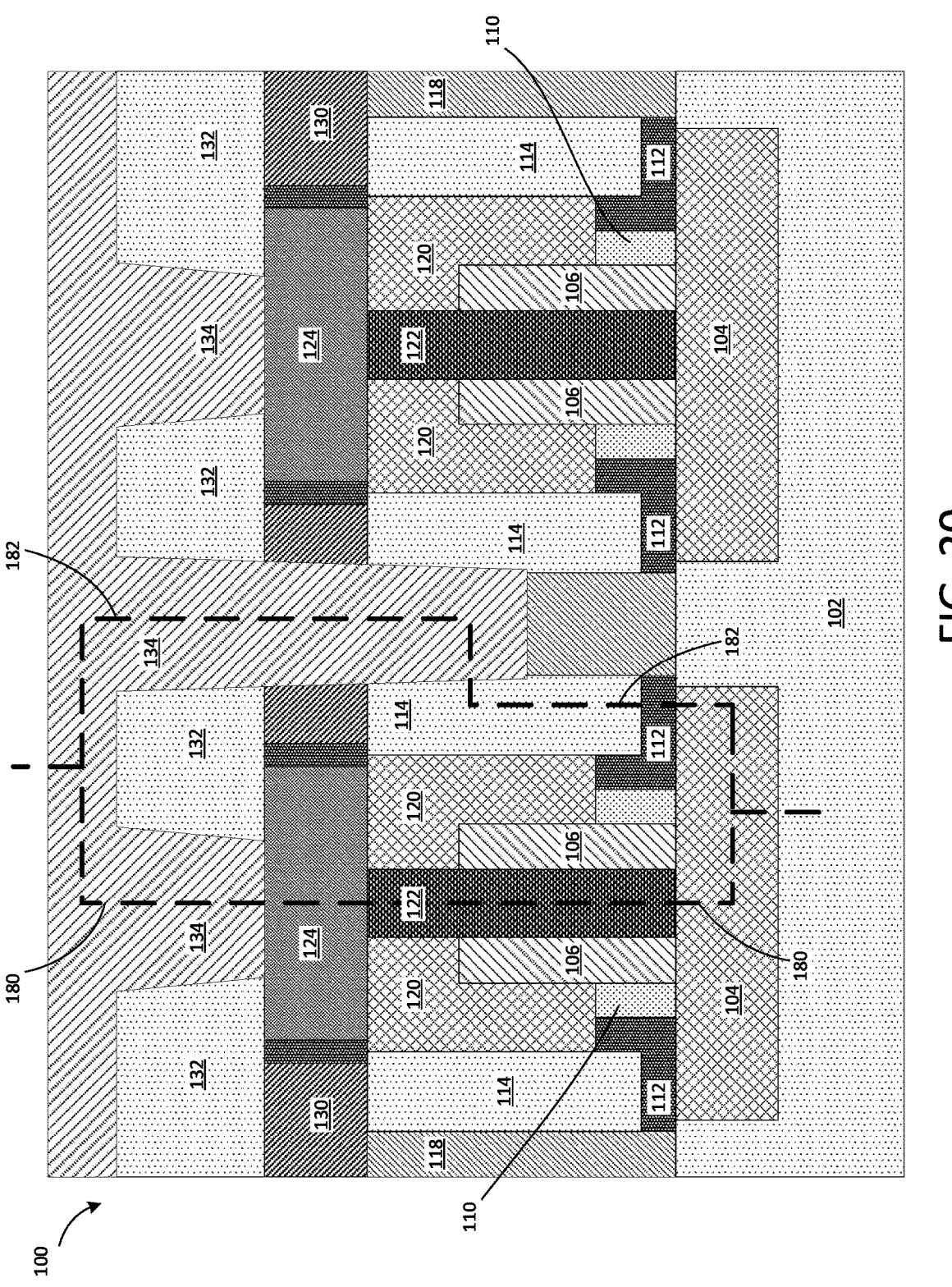
FIG. 20 is a cross-sectional view of the semiconductor device of FIG. 19 after additional fabrication operations, according to embodiments.

Referring now to FIG. 20, this figure is a cross-sectional view of the semiconductor device hybrid memory cell 100 of FIG. 19 after additional fabrication operations, according to embodiments. As shown in FIG. 20, a top metal electrode 134 is formed to connect to the phase change layer 124. Thus, there is first electrical path 180 starting from the bottom electrode 104, through the TiN layer 122 (also referred to as the heater due to the slight resistance thereof as discussed above), through the phase change layer 124, and through the top electrode 134. This first electrical path 180 corresponds to the PCM portion of the hybrid memory cell 100. There is also a second electrical path 182 that is electrically in parallel with the first electrical path 180. The second electrical path 182 starts from the bottom electrode 104, through the high-κ dielectric layer 112, through metal layer 114 and up through the top metal electrode 134. The second electrical path 182 corresponds to the ReRAM portion of the hybrid memory cell 100. As mentioned above the PCM and ReRAM portions of the hybrid memory cell 100 have complementary electrical characteristics. As discussed above, the ReRAM portion is bidirectional, and its conductance change is gradual during the RESET operation and the conductance change is abrupt during the SET operation of the hybrid memory cell 100 device. In contrast, the PCM portion has its conductance change gradually during the SET operation and the abruptly during the RESET operation.

Figures 21, 22, 23:
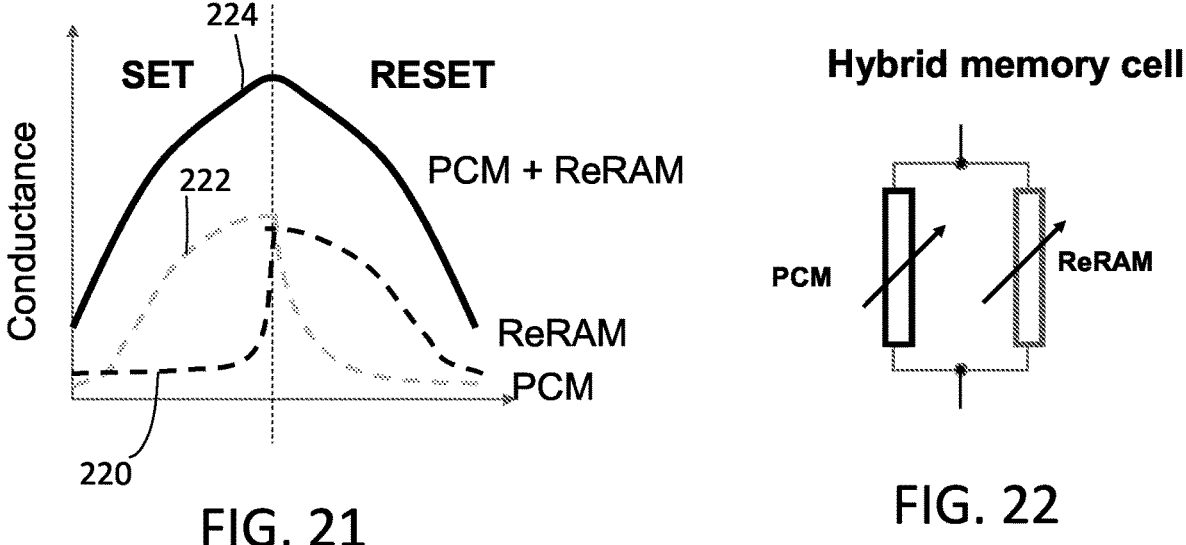
FIG. 21 is a graph showing conductance characteristics over time of a hybrid memory cell semiconductor device, according to embodiments.
FIG. 22 is a circuit diagram of an example electric hybrid memory cell semiconductor device, according to embodiments.
FIG. 23 is a chart showing example conductance change characteristics of PCM memory device, a ReRAM memory device, and a hybrid PCT+ReRAM memory device, according to embodiments.

These complementary characteristics are shown in FIG. 21, which is a graph showing conductance characteristics over time of a hybrid memory cell 100 semiconductor device, according to embodiments. As shown in FIG. 21, a ReRAM conductance change line 220 is shown for an example ReRAM memory device, and this ReRAM conductance change line 220 increases abruptly during the SET operation and decreases gradually during the RESET operation. As also shown in FIG. 21, a PCM conductance change line 222 is shown for an example PCM memory device, and this PCM conductance change line 222 increases gradually during the SET operation and decreases abruptly during the RESET operation. However, according to the present embodiments, the hybrid memory cell 100 including the PCM and ReRAM components electrically in parallel exhibits a hybrid conductance change line 224 that changes gradually in both the SET and RESET operations.

Referring now to FIG. 22, this figure is a circuit diagram of an example electric hybrid memory cell 100 semiconductor device, according to embodiments. As shown in FIG. 22, the hybrid memory cell 100 includes a PCM portion and a ReRAM portion electrically connected in parallel (i.e., similar to the first electrical path 180 and the second electrical path 182 shown in FIG. 20).

Referring now to FIG. 23, this figure is a chart showing example conductance change characteristics of PCM memory device, a ReRAM memory device, and a hybrid (i.e., PCT+ReRAM) memory cell 100 device, according to embodiments. As mentioned above, the hybrid memory cell 100 of the present embodiments exhibits a gradual conductance change in both the SET and RESET operations.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory device comprising:
a ReRAM memory element including a high-k dielectric layer configured to form a current conducting filament upon the application of voltage; and a PCM memory element that is electrically connected in parallel with the ReRAM memory element.

2. The memory device according to claim 1, wherein the ReRAM memory element is formed concentrically around the PCM memory element.

3. The memory device according to claim 1, wherein the PCM memory element includes:

a bottom electrode;

a TiN layer formed on the bottom electrode;

a phase change layer formed on the TiN layer; and a top electrode formed on the GST layer.

4. The memory device according to claim 1, wherein the ReRAM memory element includes:

a bottom electrode;

the high-K dielectric layer formed on the bottom electrode;

a metal layer formed in contact with the high-K dielectric layer; and a top electrode formed in contact with the metal layer.

5. The memory device according to claim 1, wherein the PCM memory element includes:

a bottom electrode;

a TiN layer formed on the bottom electrode; and a phase change layer formed on the TiN layer;

wherein the ReRAM memory element includes:

the high-K dielectric layer formed on the bottom electrode and around the TiN layer, wherein at least one dielectric layer is formed between the high-k dielectric layer and the TiN layer;

a metal layer formed in contact with the high-K dielectric layer; and a top electrode formed in contact with both the phase change layer of the PCM memory element and the metal layer of the ReRAM memory element, wherein the metal layer is separated from the TiN layer by the at least one dielectric layer.

6. The memory device according to claim 5, further comprising a thermal insulator layer formed around at least a portion of the TiN layer.

7. The memory device according to claim 5, wherein a first electrical path is through the bottom electrode, the TiN layer, the phase change layer, and the top electrode, wherein a second electrical path is through the bottom electrode, the high-k dielectric layer, the metal layer, and the top electrode, and wherein the first electrical path is electrically in parallel with the second electrical path.

8. The memory device of claim 4, wherein the high-K dielectric layer includes at least one selected from the group consisting of $NiO_X$, $TiO_X$, $HfO_X$, $Ta_yO_X$, $WO_X$, $ZrO_X$, $Al_yO_X$, and $SrTiO_X$.

9. The memory device of claim 1, wherein a rate of change of conductance over time in a SET operation of the memory device is at least substantially similar to a rate of change of conductance over time in a RESET operation.

10. The memory device of claim 5, wherein the phase change layer includes at least one selected from the group consisting of GeSe, AsS, GeAsTe, and GeSbTe (GST).

* * * * *